US006960920B2

(12) United States Patent
Kamitani

(10) Patent No.: US 6,960,920 B2
(45) Date of Patent: Nov. 1, 2005

(54) METHOD FOR CORRECTING MEASUREMENT ERROR AND ELECTRONIC COMPONENT CHARACTERISTIC MEASUREMENT APPARATUS

(75) Inventor: Gaku Kamitani, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/741,850

(22) Filed: Dec. 19, 2003

(65) Prior Publication Data

US 2004/0183542 A1 Sep. 23, 2004

Related U.S. Application Data

(63) Continuation-in-part of application No. 10/440,068, filed on May 15, 2003, now Pat. No. 6,838,885.

(30) Foreign Application Priority Data

| Mar. 5, 2003 | (JP) | .................................... | 2003-059034 |
| May 9, 2003 | (JP) | .................................... | 2003-132388 |
| Oct. 6, 2003 | (JP) | .................................... | 2003-347251 |

(51) Int. Cl.$^7$ .......................... G01R 35/00; G01P 21/00
(52) U.S. Cl. ........................................ 324/601; 702/85
(58) Field of Search ........................... 324/500, 601, 324/202, 629, 615, 625, 637, 638; 702/57, 65, 85, 90, 104, 107, 117, 118, 182, 189

(56) References Cited

U.S. PATENT DOCUMENTS

| 5,093,616 | A | * | 3/1992 | Seitoh et al. ................ 324/751 |
| 5,097,215 | A | * | 3/1992 | Eul et al. .................... 324/601 |
| 5,677,190 | A | * | 10/1997 | Melanson et al. .......... 436/146 |
| 5,784,299 | A | * | 7/1998 | Evers et al. .................. 702/85 |
| 6,008,656 | A | * | 12/1999 | Heuermann ................. 324/601 |
| 6,060,888 | A | * | 5/2000 | Blackham et al. .......... 324/601 |
| 6,188,968 | B1 | * | 2/2001 | Blackham .................... 702/85 |
| 6,300,775 | B1 | * | 10/2001 | Peach et al. ................. 324/601 |
| 6,396,285 | B1 | * | 5/2002 | Blackham .................... 324/601 |
| 6,492,797 | B1 | | 12/2002 | Maassen et al. .............. 324/74 |
| 6,496,785 | B1 | * | 12/2002 | Nakayama et al. ......... 702/117 |
| 6,573,497 | B1 | * | 6/2003 | Rangarajan et al. ........ 250/306 |
| 6,573,498 | B1 | * | 6/2003 | Rangarajan et al. ........ 250/307 |
| 6,647,357 | B1 | * | 11/2003 | Conte ......................... 702/189 |
| 6,697,749 | B2 | * | 2/2004 | Kamitani .................... 702/107 |

FOREIGN PATENT DOCUMENTS

EP 0 566 823 A 10/1993

OTHER PUBLICATIONS

*Measurement Calibration*, pp. 7–37–51, Agilent Technologies, Publication date 1999–2000.
*A Method To Correct Difference Of In–Fixture Measurements Among Fixtures On RF Devices*, pp. 1–4, Murata Manufacturing Co., Ltd., Published Nov., 2003.

* cited by examiner

*Primary Examiner*—Anjan Deb
*Assistant Examiner*—Hoai-An D. Nguyen
(74) *Attorney, Agent, or Firm*—Ostrolenk, Faber, Gerb & Soffen, LLP

(57) ABSTRACT

A high-precision, multi-port compatible, relative correction method and apparatus for correcting measurement errors covering an increase in the number of ports of a non-coaxial electronic component, in which a relative correction adapter 31 is provided that is formed of a two-port network connected to each port of a production test fixture 5B adjacent to a measurement apparatus. The relative correction adapter has a characteristic that modifies the electrical characteristics generated by the production test fixture 5B having an electronic component under test mounted thereon into electrical characteristics generated by a standard test fixture 5A having the electronic component under test mounted thereon. An error factor of the relative correction adapter 31 is identified from a standard test fixture measurement value and a production test fixture measurement value of a correction data acquisition specimen 11B. A production test fixture measurement value of the electronic component under test 11A is corrected with the error factor of the relative correction adapter 31 to thereby obtain the standard test fixture measurement value of the electronic component under test 11A which is assumed to be obtained when the electronic component under test 11A.

16 Claims, 27 Drawing Sheets

(a)

(b)

(c)

(d)

(e)

(f)

METHOD FOR CORRECTING MEASUREMENT ERROR AND ELECTRONIC COMPONENT CHARACTERISTIC MEASUREMENT APPARATUS

CROSS-REFERENCE TO RELATED APPLICATIONS

This is a Continuation-In-Part of U.S. patent application Ser. No. 10/440,068, filed May 15, 2003, now U.S. Pat. No. 6,838,885, in the name of Gaku KAMITANI, entitled METHOD OF CORRECTING MEASUREMENT ERROR AND ELECTRONIC COMPONENT CHARACTERISTIC MEASUREMENT APPARATUS.

BACKGROUND OF THE INVENTION

1. Field of the Invention

The present invention relates to a method of correcting a measurement error in which when electrical characteristics of an electronic component under test having a plurality of ports are measured using a test instrument with the electronic component under test mounted on a production test fixture, a production test fixture measurement value of the electronic component under test using the production test fixture is corrected to electrical characteristics that are assumed to be obtained when one of the test instrument and another test instrument considered equivalent to the test instrument in measurement performance characteristic measures the electronic component under test in the mounted state thereof on a standard test fixture that results in a measurement result of electrical characteristic of the electronic component different from the measurement result of electrical characteristic of the electronic component provided by the production test fixture. The present invention also relates to an electronic component characteristic measurement apparatus performing the measurement error correction method.

2. Description of the Related Art

An SOLT calibration method is carried out to remove the effect of an error of a measurement system from a measurement value. A standard device having a true physical value of an electrical characteristic (such as a scattering coefficient) identified beforehand is prepared. Here, a coaxial electronic component having the true physical value of the electrical characteristic at an extreme limit is used as a standard device. The coaxial electronic component is used as a standard device because it is relatively easy to identify the true physical value of the electrical characteristic in the coaxial electronic component having the extreme value in electrical characteristic. The true physical values in the electrical characteristics of the coaxial electronic component in electrical states such as an open circuit, short circuit, and termination exhibit extreme values. Such a coaxial electronic component is used as a standard device. Determination of the true physical value of the electrical characteristic of the electronic component such as the coaxial electronic component is here referred to as identifying the true physical value.

Returning to the discussion of the SOLT calibration. A standard device prepared is connected to the end of a coaxial cable with the other end connected to one or a plurality of connection ports arranged on a measurement apparatus. Electrical characteristics of the standard device are measured in this setup. With the standard device removed, the terminals of the coaxial cables (the ports on the measurement apparatus) are connected to each other (in a through connection). The electrical characteristics of the cable are then measured. An error factor up to the ends of the coaxial cable is identified from the electrical characteristics in a state with the standard device connected. The effect of an error is removed from the measured electrical characteristics by identifying the error factor. The electrical characteristics of a coaxial electronic component connected to the ends of the coaxial cable are thus calculated. The end of the coaxial cable serves as a calibration plane.

A correspondence between a measurement value and a true physical value of the standard device is calculated (the error factor of the standard device is identified). When electrical characteristics of an actual specimen are measured, the measurement value is corrected based on the calculated correspondence (the effect of the error factor is removed using calculation). The calculation of the correspondence and the correction of the measurement value based on the correspondence (the identification of the error factor and the removal of the error factor through calculation) are referred to as a calibration. The SOLT calibration is one of such calibrations.

An electronic component having no coaxial connector (referred to as a non-coaxial electronic component), such as a surface mounted electronic component, needs to be subjected to the above calibration when electrical characteristics of such a component are measured. A coaxial cable connected to a connection port of a measurement apparatus is connected to a non-coaxial electronic component through a fixture. The fixture has a coaxial connector which is to be connected to the coaxial cable. The fixture is connected with the coaxial connector that is connected to the coaxial cable. The measurement apparatus measures the electrical characteristics of the non-coaxial electronic component mounted on the fixture connected to the coaxial cable.

A standard device is required in principle to calibrate the non-coaxial electronic component. It is practically impossible to produce a standard device for these non-coaxial electronic components. This is because the identification of the true physical value of a standard device other than coaxial types is extremely difficult. If the non-coaxial electronic component is calibrated in a state with a non-coaxial standard device unemployed, a calibration plane becomes the end of the coaxial cable regardless of a fixture attached to the coaxial cable. For this reason, the non-coaxial electronic component is measured in electrical characteristics with the non-coaxial electronic component mounted on the fixture employed at no calibration plane.

There is a possibility that an error takes place in the fixture. The electrical characteristics of the non-coaxial electronic component are identified without paying attention to an error factor caused by the fixture or the error factor due to the fixture is estimated through calculation based on physical dimensions of the fixture. The estimated error factor of the fixture is removed from measured electrical characteristics through calculation. The precision of calibration is thus heightened during measurement of the non-coaxial electronic component. (see, for example, Agilent Technologies 8720ES User's Guide p. 7-37 to p. 7-51.)

A conventional art for calibrating a non-coaxial electronic component during a particular measurement does not provide necessarily a high calibration accuracy. As discussed above, a calibration plane of a measurement apparatus (mainly, a network analyzer) is forced to be at a coaxial face such as the end of a coaxial cable. A measurement apparatus tests a electronic component connected through a calibration plane subject to restrictions. However, a non-coaxial electronic component is not directly connected to the coaxial face (a calibration plane). For measurement, a non-coaxial electronic component is connected to the measurement apparatus through a fixture which is a sort of a transmission line. Each fixture has its own characteristics, and it is difficult to make uniform characteristics among a plurality of fixtures. When characteristics of the non-coaxial electronic component are measured through the fixture, an error unique to each fixture naturally occurs. This creates variations in measurement results, thereby leading to a degradation in calibration accuracy.

Making uniform characteristics among a plurality of fixtures in a non-coaxial electronic component having three ports (such as a duplexer) is even more difficult, and fixtures are not practicable.

Electronic components working on a balanced signal in high frequency regions rather than on an unbalanced signal are currently increasing in number. A balanced signal is transmitted as two signals different in phase by 180° and a received signal is picked up at a receiver side of the balanced signal as a difference between the two signals. Because of its excellent noise immunity over a conventional unbalanced signal, the balanced signal is preferably currently used. Since a single signal is transmitted as two signals in the balanced signal mode, one balanced port corresponds to two unbalanced ports. For example, a filter having balanced input and output is a two-port device, but practically corresponds to an unbalanced device having four ports. In fact, the filter having the balanced input and output is provided with four input and output terminals in addition to a ground terminal.

With more and more electronic components becoming balanced, the number of ports of non-coaxial electronic components such as surface mounted components is expected to increase. There is a need for a relative correction method (calibration method) which works with these types of electronic components, provides high calibration accuracy, and satisfies multi-port requirements.

SUMMARY OF THE INVENTION

To overcome the above-mentioned drawback, the present invention provides a method of correcting a measurement error in which when electrical characteristics of an electronic component under test having a plurality of ports are measured using a test instrument with the electronic component under test mounted on a production test fixture, a production test fixture measurement value of the electronic component under test using the production test fixture is corrected to electrical characteristics that are assumed to be obtained when one of the test instrument and another test instrument considered equivalent to the test instrument in measurement performance characteristic measures the electronic component under test in the mounted state thereof on a standard test fixture that results in a measurement different from the measurement provided by the production test fixture.

The method of the present invention includes preparing at least three correction data acquisition specimens different in electrical characteristics and having an extremely small transmission coefficient between ports thereof, acquiring a standard test fixture measurement value of the correction data acquisition specimens by measuring electrical characteristics of the correction data acquisition specimens in the mounted state thereof on the standard test fixture using one of the test instrument and the another test instrument, acquiring a production test fixture measurement value of the correction data acquisition specimens by measuring electrical characteristics of the correction data acquisition specimens in the mounted state thereof on the production test fixture using one of the test instrument and the another test instrument, identifying an error factor of a relative correction adapter from the standard test fixture measurement values and the production test fixture measurement value of the correction data acquisition specimens, the relative correction adapter being modeled as including a two-port network connected to ports of the production test fixture adjacent to the test instrument, and as having a characteristic that modifies the electrical characteristics generated by the production test fixture having the electronic component under test mounted thereon into the electrical characteristics generated by the standard test fixture having the electronic component under test mounted thereon, a step of acquiring a production test fixture measurement value of the electronic component under test by measuring the electronic component under test in the mounted state thereof on the production test fixture using one of the test instrument and the another test instrument, and calculating a standard test fixture measurement value of the electronic component under test which is assumed to be obtained when one of the test instrument and the other test instrument measures the electronic component under test in the mounted state thereof on the standard test fixture, by correcting the production test fixture measurement value of the electronic component under test with the error factor of the relative correction adapter.

The present invention further relates to an electronic component characteristic measurement apparatus, including a test instrument that measures electrical characteristics of an electronic component under test having a plurality of ports in the mounted state thereof on a production test fixture, and corrects the electrical characteristics of the electronic component tested on a test instrument in the mounted state thereof on the production test fixture to electrical characteristics that are assumed to be obtained when one of the test instrument and another measuring apparatus including a test instrument considered equivalent to the test instrument in measurement performance characteristic measures the electronic component under test in the mounted state thereof on a standard test fixture that results in a measurement result of electrical characteristic of the electronic component of different from the measurement result of electrical characteristic of the electronic component provided by the production test fixture.

The electronic component characteristic measurement apparatus of the present invention includes means for acquiring a standard test fixture measurement value of the correction data acquisition specimen by measuring electrical characteristics of at least three correction data acquisition specimens, different in electrical characteristics and having an extremely small transmission coefficient between ports thereof, in the mounted state thereof on the standard test fixture, using the test instrument, means for acquiring a production test fixture measurement value of the correction data acquisition specimens by measuring electrical characteristics of the correction data acquisition specimens in the mounted state thereof on the production test fixture using the test instrument, means for identifying an error factor of a relative correction adapter from the standard test fixture measurement values and the production test fixture measurement values of the correction data acquisition specimens, the relative correction adapter being modeled as including a two-port network connected to ports of the production test fixture adjacent to the measurement apparatus, and as having a characteristic that modifies the electrical characteristics generated by the production test fixture having the electronic component under test mounted thereon into the electrical characteristics generated by the standard test fixture having the electronic component under test mounted thereon, means for acquiring a production test fixture measurement value of the electronic component under test by measuring the electronic component under test in the mounted state thereof on the production test fixture using the test instrument, and means for calculating a standard test fixture measurement value of the electronic component under test which is assumed to be obtained when one of the test instrument and the other measurement apparatus measures the electronic component under test in the mounted state thereof on the standard test fixture, by correcting the production test fixture measurement value of the electronic component under test with the error factor of the relative correction adapter.

In accordance with the present invention, the standard test fixture measurement value is estimated by determining the state of the relative correction adapter arranged on each port of a model represented by the production test fixture measurement value.

The correction method of the present invention assumed on the relative correction adapter is implemented in a linear simultaneous equation in which the production test fixture measurement value is a known constant while the standard test fixture measurement value is an unknown variable. The number of terms of the linear simultaneous equation is three times the number of ports. By solving the linear simultaneous equation, the correction method of the present invention is carried out.

The linear simultaneous equation is easily and automatically expressed using a computer algorithm. The correction method corresponding to a measurement system having any number of ports is provided by solving the linear simultaneous equation using a typical method such as the LU decomposition. This method is versatile enough to be applied to a measurement system without regard to the number of ports in use. If the speed of correction process is important, the linear simultaneous equation may be algebraically solved beforehand, and a correction calculation may be performed using the equation.

The solving of the linear simultaneous equation with the production test fixture measurement value being the known constant and the standard test fixture measurement value being an unknown variable is equivalent to the execution of the above-mentioned SOLT calibration. In other words, the implementation of the correction method of the present invention is equivalent to the execution of the SOLT calibration in the measurement system having any number of ports.

In the correction method and characteristic measurement apparatus of the present invention, a plurality of correction data acquisition specimens are measured on each of a production test fixture and a standard test fixture, and a relative correction adapter is determined from the measurement results. The required number of correction data acquisition specimens is theoretically three regardless of the number of ports in the measurement system. It is not necessary to have identified the true physical value of the correction data acquisition specimen, but the transmission coefficient thereof must be sufficiently small.

The correction method of the present invention neglects the effect of leakage (direct wave). When a fixture with a low degree of isolation is used in measurement, a correction error takes place. The correction error may be reduced using a so-called offset correction together.

When the present invention is implemented, an unbalanced input—balanced output device may be tested as an unbalanced device having three ports, and a balanced signal may be naturally determined from an unbalanced signal subsequent to correcting the results of the test through the correction method of the present invention. In accordance with the present invention, a balanced system under test may be measured as an unbalanced system under test, and then the present invention is applied to the measurement results. The relative correction is thus accomplished.

In an embodiment of the present invention, the electrical characteristics of one of the correction data acquisition specimen and the electronic component under test are preferably measured in a state that one of a DC current and a DC voltage is applied to the one of the correction data acquisition specimen and the electronic component under test through each fixture so that the value of the one of the DC current and the DC voltage applied to the one of the correction data acquisition specimen and the electronic component under test remains unchanged in each of the step or means of acquiring the standard test fixture measurement value of the correction data acquisition specimen, the step or means of acquiring the production test fixture measurement value of the correction data acquisition specimen, and the step or means of acquiring the production test fixture measurement value of the electronic component under test. In this arrangement, the present invention is applied to the error correction method for use in active electronic components such as a bipolar transistor, an FET, or an amplifier including these devices.

AC characteristics of active electronic components typically greatly vary depending on the magnitude of a DC voltage applied thereto or the magnitude of a DC current flowing therethrough. A circuit incorporated in a production test fixture for testing an active electronic component occasionally includes an electronic component, such as a electrolytic capacitor, a high dielectrics constant type monolithic ceramic capacitor, or a semiconductor device like a diode. These electronic components changes AC characteristics depending on the magnitude of a voltage applied thereto or the magnitude of a current flowing therethrough. When the correction data acquisition specimen or the electronic component under test is measured using the fixture incorporating such a electronic component having that feature, and if the applied state of the DC voltage or the flowing state of the DC current changes from when the correction data acquisition specimen is measured to when the (active) electronic component under test is measured, the AC characteristics of both the active electronic component and the fixture may change.

The AC characteristics of the active electronic component vary greatly depending on the magnitude of the voltage applied to the fixture or the magnitude of the current flowing through the fixture. Since the variations appear as a result of the change of electrical characteristics of the active electronic component under test, correcting the variations using the relative correction method of the present invention is difficult. This is because the relative correction method of the present invention is a method intended to correct a measurement value that varies due to variations in an error of the fixture superimposed on the electrical characteristics of the active electronic component with the electrical characteristics of the electronic component remaining intact.

If the above-referenced improvements in the application conditions of the current or voltage are added to the error correction method of the present invention, the characteristics of the electronic component incorporated in the circuit forming the fixture are apparently considered as those of the electronic component under test. As a result, variations in the electrical characteristics of the active electronic component under test are prevented from changing.

A substantially equal current may differ depending on the active electronic component under test. In most active electronic components, a difference of 0.05 volt in voltage and a difference of 0.1 mA in current are regarded as the substantially equal voltage and current, respectively.

Unlike the AC characteristics, the value of one of the DC voltage and the DC current applied to the active electronic component under test through the production test fixture is relatively easily equalized with the value of one of the DC voltage and the DC current applied to the active electronic component under test through the standard test fixture.

This purpose is accomplished by:

using a regulated power supply and employing electronic components, such as resistors, having a strict tolerance (as good as ±5%) in the power supply. The DC characteristics are not affected by a mounting state of components soldered to a circuit board.

When the present invention is implemented, the correction data acquisition specimen preferably has a construction that at least one of the ports thereof prevents a DC current from flowing therethrough.

In accordance with the present invention, the correction data acquisition specimen may have opened, shorted, and terminated features. However, if the correction data acquisition specimen having a shorted feature is mounted on a fixture (a production test fixture or a standard test fixture) for measuring an active electronic component, a large DC current flows between electrodes of the fixture. The DC voltage or the DC current in the fixture circuit becomes different from that during the measurement of the active electronic component under test, thereby degrading calibration accuracy. The correction data acquisition specimen having the terminated feature suffers a similar problem, if not pronounced as in the shorted case.

As discussed above, if the electrical characteristics of the correction data acquisition specimen are measured in a state that at least one of the ports of the correction data acquisition specimen prevents a DC current from flowing therethrough, the relationship of the DC voltage or the DC current of the fixture circuit remains unchanged. In this way, the calibration accuracy is free from degradation. For example, a capacitor may be connected to the port of the correction data acquisition specimen to allow an AC current only to flow therethrough with a DC signal blocked.

When at least one connection terminal of the active electronic component under test is directly connected or at least AC coupled to a ground potential of the fixture circuit, any correction data acquisition specimen having a variety of electrical characteristics with respect to the ground potential may be easily produced. However, if none of the connection terminals of the active electronic component under test is connected to the ground potential and if an electronic component in the fixture circuit is arranged with respect to the ground potential, it is difficult to determine which terminal the electrical characteristics of the correction data acquisition specimen are to be measured with respect to. In this case, the correction data acquisition specimen cannot be embodied.

Preferably, the present invention further includes a step of preparing, as the standard test fixture and the production test fixture, fixtures each having at least one ground connection terminal connected to a ground potential of the respective fixture in addition to connection terminals thereof corresponding to ports of the correction data acquisition specimen and the electronic component under test, a step of preparing, as the correction data acquisition specimen, at least one specimen having a terminal to be connected to the ground connection terminal, and a step of measuring the electrical characteristics of the correction data acquisition specimen with the terminal of the correction data acquisition specimen connected to the ground connection terminal in the step of acquiring the production test fixture measurement value of the correction data acquisition specimen having the terminal.

Even if there is an electronic component present with respect to the ground potential in the fixture circuit of each of the standard test fixture and the production test fixture, the correction data acquisition specimen is formed. As a result, the relative correction method of the present invention is thus embodied. The ground connection terminal is preferably connected to the ground potential of each fixture circuit.

In the above discussion, a three-port amplifier device with one of the three terminals grounded is handled as a two-port device with the one terminal serving as a reference. Such a device is shown in FIGS. 27(a) and 27(b). In practice, however, there are times when none of the terminals can be directly connected to the ground potential. FIG. 27(c) shows such a typical example in which a drain current or a gate voltage must be determined by adding a resistor to a source in a common-source amplifier circuit of FET 70. This operation requires a zero bias design. In operation, characteristics of the circuit are affected by high-frequency characteristics of a resistor connected to the source. There occur variations in measurement values due to the difference in that element. For this reason, the FET 70 as the active electronic component under test must be handled as a three-port device. The common-source circuit will be discussed further.

If a resistor is connected to the source, the gain of the amplifier device decreases. In practice, there is no case in which the gain of an amplifier device in a high frequency region above several GHz becomes too much. To decrease source impedance, a resistor 71 and a capacitor 72 in parallel connection are connected to the source as shown in FIG. 27(d), and the capacitor 72 typically AC couples the source of the FET 70 to the ground potential. The problem here is that the source impedance is unavoidably varied by a fixture (capacitor). If the source impedance, i.e., the impedance of the capacitor 72 is set to be sufficiently small, the FET 70 as the (active) electronic component under test may be handled as a two-port device. If such a setting is difficult and there is no other way but to control the source impedance, a coupling capacitor 73 is added to a fixture circuit forming a fixture (a standard test fixture or a production test fixture). A three-port fixture circuit results as shown in FIG. 27(e). If the impedance of the AC grounded coupling capacitor 73 is sufficiently small, no signal appears on a port 3 in the fixture circuit. In practice, however, perfect zero ohm cannot be achieved, and there appears some signal. In a two-port measurement, a difference from fixture to fixture cannot be corrected because the state of the source terminal is not known. In a three-port measurement, the state of the source terminal is learned, and a correction adapter type relative correction is carried out in the three-port device.

If the source terminal is not AC grounded, a resistor 71 and a capacitor 72 are connected between a newly added capacitor 73' and the FET 70 as shown in FIG. 27(f). In this case, however, the impedance at the ground surface is extremely low. There are times when no sufficient effectiveness is achieved because all signals observed at the port 3 are reflected ones.

Other features and advantages of the present invention will become apparent from the following description of embodiments of the invention which refers to the accompanying drawings.

DETAILED DESCRIPTION OF THE PREFERRED EMBODIMENTS

One embodiment of the present invention is discussed below. In the present embodiment, a surface mounted SAW filter is handled as an electronic component under test, and a measurement apparatus containing a network analyzer measures electrical characteristics of the surface mounted SAW filter. The present invention is implemented in a method of the test instrument for correcting an error in a measurement value thereof and an electrical characteristic measurement apparatus that adopts the correction method. The present invention is applicable to the correction method for correcting measurement results obtained from a device having at least two ports, and three ports in particular. The following discussion of the present invention focuses on a correction method for three-port measurement results, and an electrical characteristic measurement apparatus that adopts that correction method. However, the present invention is equally applicable to a correction method for four-port measurement results and an apparatus that adopts that correction method. Likewise, the present invention is equally applicable to a correction method for one-port measurement results, and an apparatus that adopts that correction method, and a correction method for two-port measurement results, and an apparatus that adopts that correction method.

Figure 1:
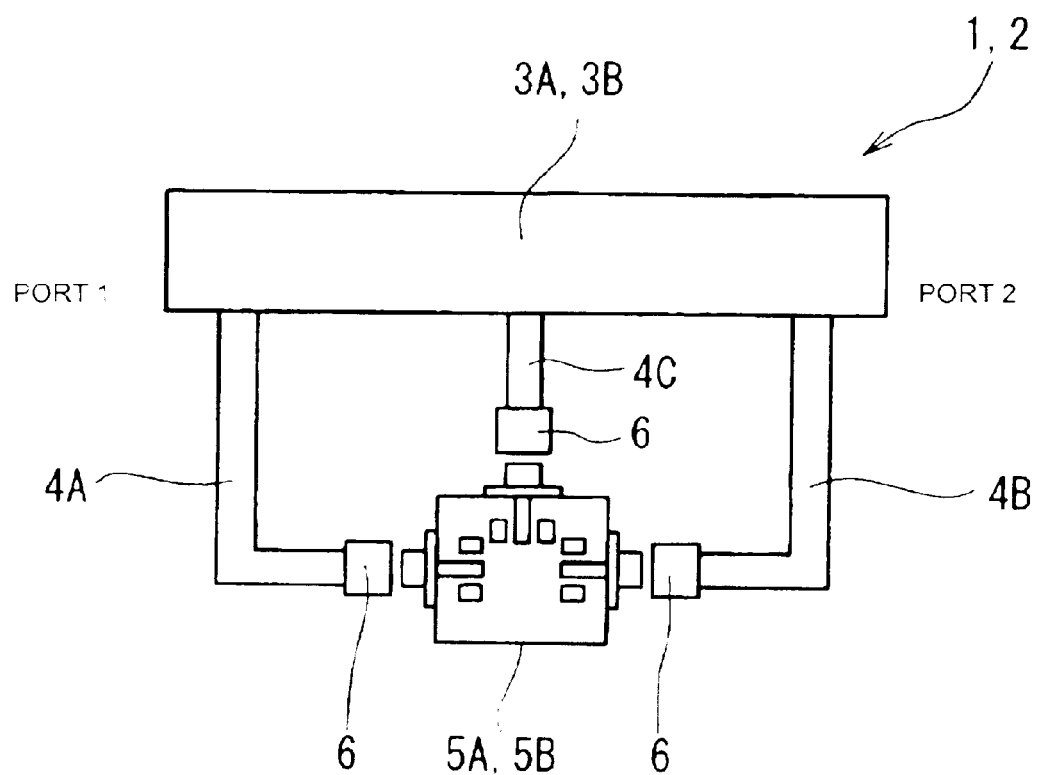
FIG. 1 is a plan view diagrammatically showing a measurement apparatus that carries out a correction method of measurement errors in accordance with the present invention.
Figure 2:
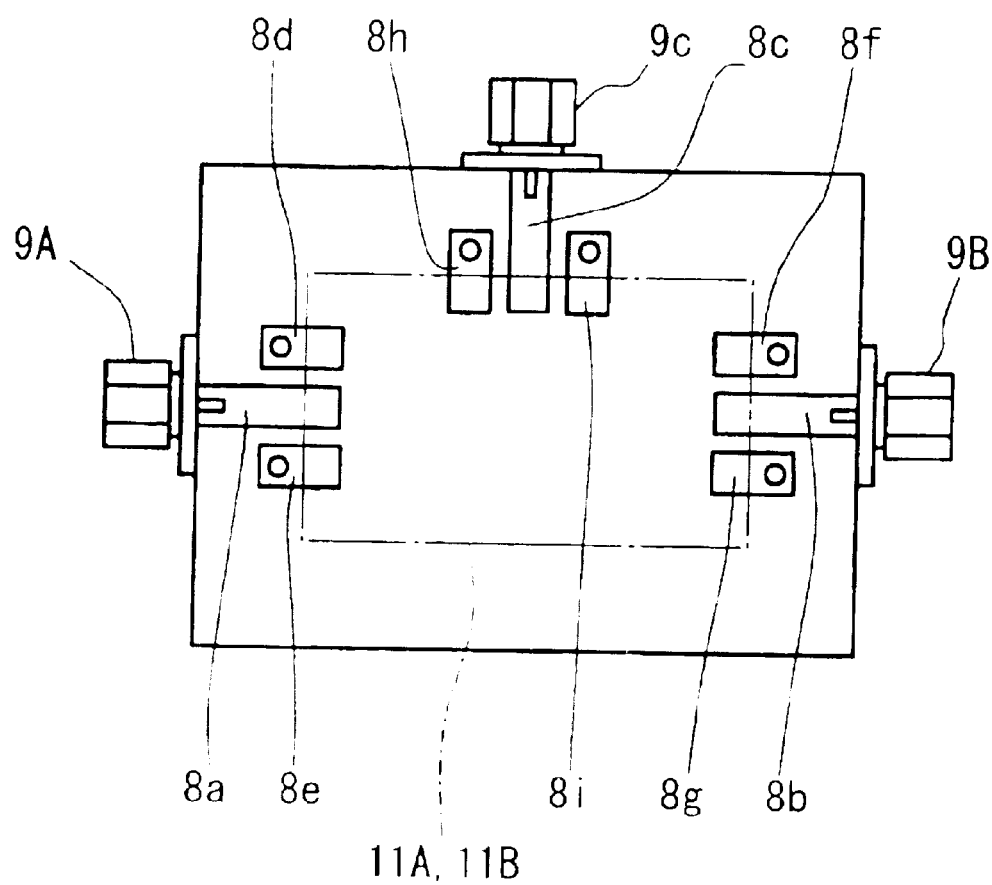
FIG. 2 is a plan view showing the structure of a test fixture forming the measurement apparatus for carrying out the correction method of measurement errors in accordance with the present invention.
Figure 3:
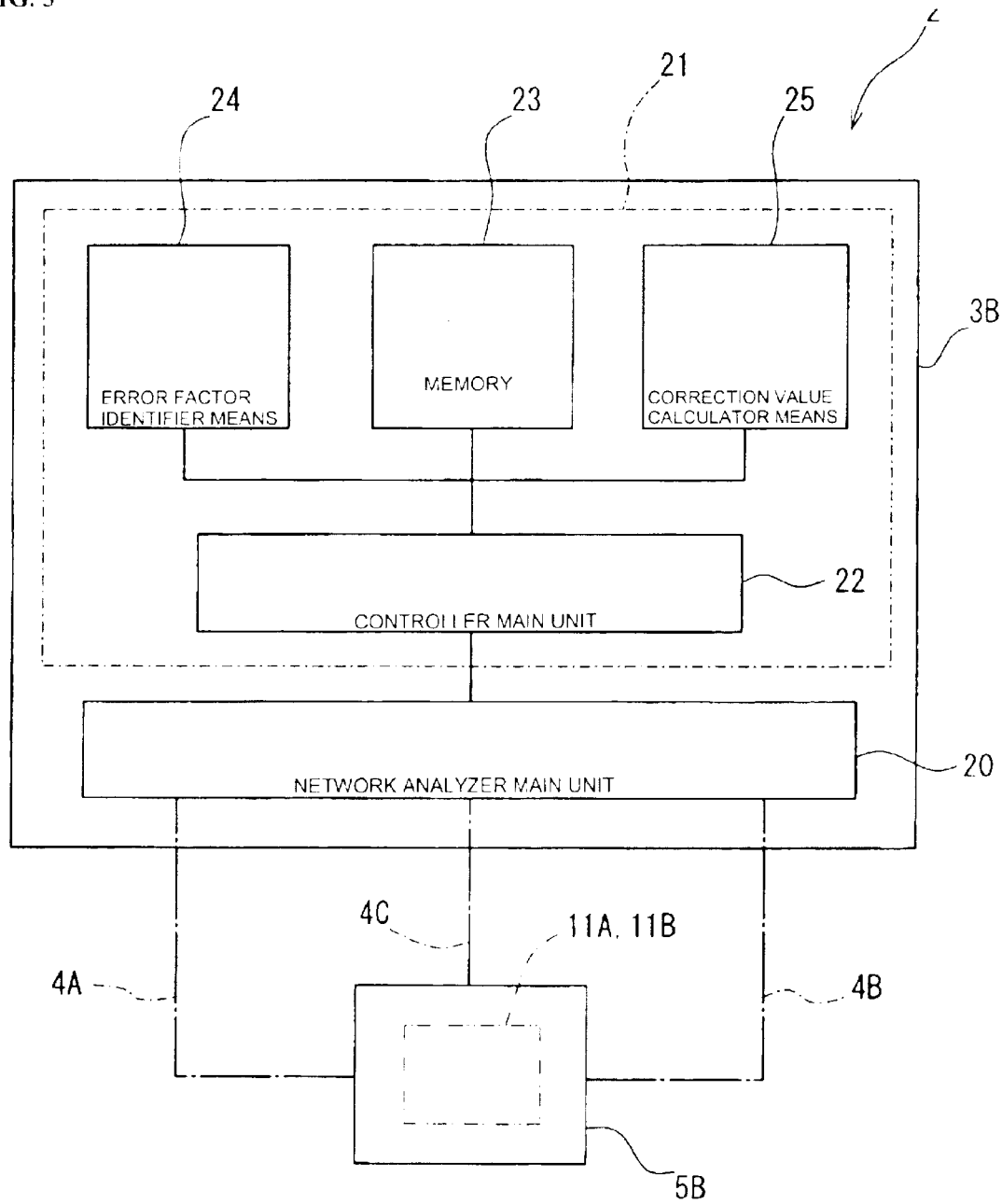
FIG. 3 is a block diagram diagrammatically showing the structure of the measurement apparatus that performs the measurement error correction method.
Figure 4:
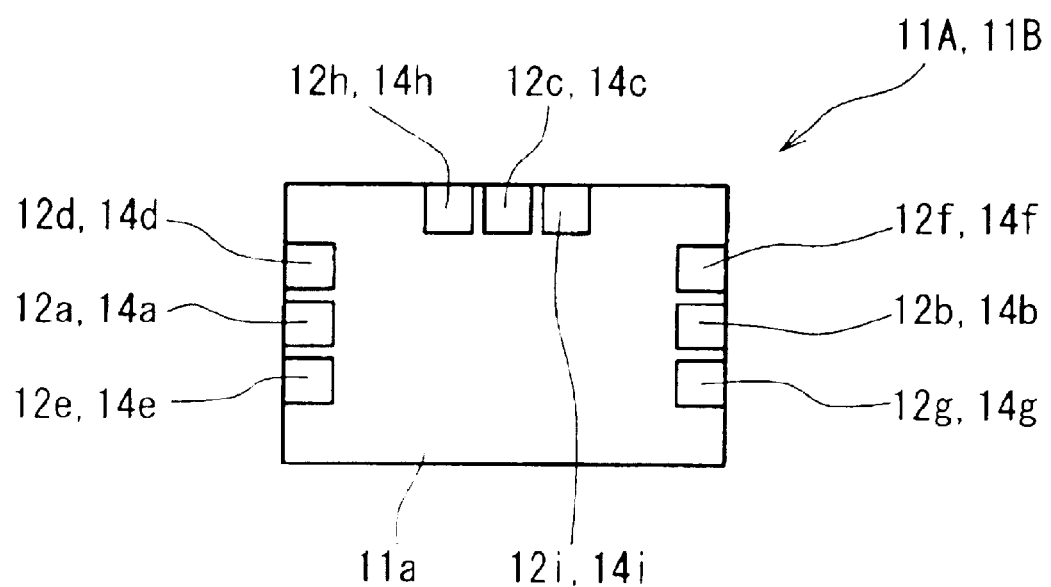
FIG. 4 is a rear view of a correction data acquisition specimen and an electronic component under test forming the measurement apparatus that carries out the measurement error correction method of the present invention.

FIG. 1 is a plan view of the structure of a standard characteristic measurement apparatus and a production characteristic measurement apparatus in accordance with an embodiment of the present invention, FIG. 2 is a plan view of the structure of a test fixture, FIG. 3 is a block diagram of the structure of a network analyzer of the characteristic measurement apparatus, and FIG. 4 is a bottom view of the structure of an electronic component as a specimen to be measured and a correction data acquisition specimen.

The production measurement apparatus 2, and the standard measurement apparatus 1 are regarded as having identical measurement performance characteristics, and are manufactured substantially the same. However, as long as the two instruments provide substantially identical measurement performance characteristics, the apparatuses 1 and 2 may have different structures. The apparatuses 1 and 2 may be set to have identical measurement performance characteristics by performing a calibration using a coaxial standard device.

The apparatuses 1 and 2 measure electrical characteristics of an electronic component 11A or a correction data acquisition specimen 11B, each having a plurality of ports, in a state with the electronic component 11A or the correction data acquisition specimen 11B mounted on a standard test fixture 5A or a production test fixture 5B.

The production measurement apparatus 2 has a function of correcting a measurement value obtained from the electronic component 11A in a state with the electronic component 11A mounted on the production test fixture 5B to electrical characteristics that are assumed to be obtained when the electronic component 11A is measured in the mounted state thereof on the standard test fixture 5A different in characteristics from the production test fixture 5B.

As shown in FIG. 1, the apparatuses 1 and 2 include network analyzers 3A and 3B, coaxial cables 4A, 4B, and 4C, and the standard test fixtures 5A and 5B. The network analyzer 3A and the standard test fixture 5A belong to the standard measurement apparatus 1, and the network analyzer 3B and the production test fixture 5B belong to the production measurement apparatus 2.

The network analyzers 3A and 3B measure electrical characteristics of an electronic component used in high frequency regions, and have a plurality of input and output ports (three ports of port 1, port 2, and port 3 in this embodiment). The coaxial cables 4A, 4B and 4C are respectively connected to the ports 1–3. The free ends of the coaxial cables 4A, 4B and 4C have respectively coaxial connectors 6 attached thereto. The network analyzers 3A and 3B are means for acquiring standard test fixture measurement values of the electronic component 11A and the correction data acquisition specimen 11B and means for acquiring production test fixture measurement values of the electronic component 11A and the correction data acquisition specimen 11B.

As shown in FIG. 2, the test fixtures 5A and 5B include an insulating board 7, a connection wiring section 8, and coaxial connectors 9A, 9B and 9C. The connection wiring section 8 is formed on a top surface 7a of the insulating board 7, and includes signal transmission lines 8a, 8b and 8c, and ground lines 8d–8i. The signal transmission lines 8a, 8b and 8c respectively extend toward the center of the insulating board 7 on the surface 7a thereof from the edge of the insulating board 7, and terminated at the ends thereof in the center portion of the insulating board 7 with a spacing allowed between the ends. The ground lines 8d–8i are arranged in the center portion of the insulating board 7 in their respective positions on both sides of each of the signal transmission lines 8a, 8b and 8c. The ground lines 8d and 8e arranged on the sides of the transmission line 8a, the ground lines 8f and 8g arranged on the sides of the transmission line 8b, and the ground lines 8h and 8i arranged on the sides of the signal line 8c are spaced apart from each other (like the signal transmission lines 8a, 8b and 8c).

The signal transmission lines 8a, 8b and 8c are respectively connected to inner conductors (not shown) of the coaxial connectors 9A, 9B and 9C. The ground lines 8d–8i are connected to a ground pattern (not shown) on the rear surface of the insulating board 7 through respective through-hole conductors 10, and are then connected to outer conductors (not shown) of the coaxial connectors 9A, 9B and 9C.

Referring to FIG. 2, the standard test fixture 5A of the standard measurement apparatus 1 and the production test fixture 5B of the production measurement apparatus 2 are identically shaped, but it is not a requirement that the two fixtures have an identical shape. The production test fixture 5B may be different in shape from the standard test fixture 5A, and may have a shape appropriate for use in an automatic classification and measurement apparatus.

The network analyzer 3B constituting the production measurement apparatus 2 includes a network analyzer main unit 20 and a controller 21 as shown in FIG. 3. The controller 21 includes a controller main unit 22, a memory 23, an error factor identifier means 24, and a correction value calculator means 25.

The electronic component 11A and the correction data acquisition specimen 11B are electronic components, each having at least three input and output ports (three ports in this embodiment). As shown in FIG. 4, each of the electronic component 11A and the correction data acquisition specimen 11B has, on a rear surface 11a, transmission line terminals 12a, 12b and 12c, and ground terminals 12d–12i. The transmission line terminals 12a, 12b and 12c and the ground terminals 12d–13i are respectively pressed into contact with the signal transmission lines 8a, 8b and 8c and the ground lines 8d–8i by engaging the rear surface 11a of each of the specimens 11A and 11B with the top surface 7a of each of the test fixtures 5A and 5B. In this way, the electronic component 11A and the correction data acquisition specimen 11B are mounted on the standard test fixtures 5A and 5B.

Prepared as the correction data acquisition specimen 11B in this embodiment is a specimen that exhibits electrical characteristics equivalent to those of the electronic component 11A when the measurement apparatuses 1 and 2 perform a measurement operation. Three correction data acquisition specimens 11B different in the electrical characteristics (such as a reflection coefficient) which are measured by the measurement apparatus are prepared. The correction data acquisition specimen 11B has an extremely small transmission coefficient between ports. Preferably, a port-to-port transmission coefficient of the correction data acquisition specimen 11B is −20 dB or smaller. At least three of such correction data acquisition specimens 11B having these features are prepared regardless of the connection ports thereof.

The correction method of the measurement apparatuses 1 and 2 of this embodiment for correcting the measurement error is discussed below. In the correction method of the measurement apparatuses 1 and 2 (hereinafter referred to as a correction adapter type relative correction method), each of the three correction data acquisition specimens 11B is measured on each of the production test fixture 5B and the standard test fixture 5A. A correction coefficient (a relative correction adapter) is determined from the measurement results. The required number of correction data acquisition specimens 11B is three during the setting of the correction coefficient in principle regardless of the number of ports. Although it is not necessary to have identified the true physical value of the correction data acquisition specimen 11B, the transmission coefficient thereof must be sufficiently small.

The purpose of the correction method (the correction adapter type relative correction method) of the present invention is that an electrical characteristic (hereinafter referred to as a standard test fixture measurement value) measured by the standard measurement apparatus 1 in a state with a target to be measured (a non-coaxial electronic component) mounted on the standard test fixture 5A is estimated from an electrical characteristic (hereinafter referred to as a production test fixture measurement value) measured by the production measurement apparatus 2 in a state with the target mounted on the production test fixture 5B.

The standard test fixture 5A is a fixture by which an electronic component is measured to obtain a measurement value, and then the measurement value serves as a standard measurement value of the electronic component. For example, when an electronic component manufacturer guarantees, to a user of an electronic component, characteristic of the electronic component which has been measured using a fixture. That fixture corresponds to the standard test fixture 5A. The production test fixture 5B is the one that is actually used to measure the electronic components. An example of the production test fixture 5B is a fixture which measures electrical characteristics of electronic components in a performance classification process, for example, for example, an automatic performance classifier.

Due to their structures, a plurality of fixtures have difficulty in coinciding with each other in measurement values thereof at a high precision. For this reason, the measurement value obtained from the production test fixture 5B and the measurement value obtained from the standard test fixture 5A fail to coincide with each other without correction. The production test fixture 5B and the standard test fixture 5A have such a relationship.

The measurement values measured by the standard test fixture 5A and the production test fixture 5B are respectively referred to as a standard test fixture measurement value and a production test fixture measurement value.

The network analyzer is used as a test instrument of each of the standard measurement apparatus 1 and the production measurement apparatus 2. If a SOLT calibration or a TRL calibration is performed at the end of a coaxial cable connected to each port of the network analyzer (hereinafter referred to as a coaxial connection point), the true value of a scattering coefficient of any circuit connected to the coaxial connection point may be determined. The coaxial connection point at which the SOLT calibration or the TRL calibration is performed is referred to as a calibration plane.

When electrical characteristics of a non-coaxial electronic component are measured using the measurement apparatuses 1 and 2, the standard test fixture 5A or the production test fixture 5B is mounted at the calibration plane. The electrical characteristics of the non-coaxial electronic component are measured in a state with the non-coaxial electronic component mounted on the standard test fixture 5A or the production test fixture 5B. Even the standard test fixture measurement value is not the true value of the specimen. The standard test fixture measurement value includes the true value of the specimen and a measurement error attributed to the standard test fixture 5A superimposed on the true value. The correction adapter type relative correction method of the present invention estimates the standard test fixture measurement value at a high precision based on the assumption that the determination of the true value of the specimen is impossible.

The correction adapter type relative correction method of the present invention will now be discussed with reference to a two-port measurement system. The two-port measurement system is discussed here for understanding the correction adapter type relative correction method of the present invention with ease. As will be discussed later, the correction adapter type relative correction method of the present invention is applicable to a measurement system having n ports (n is a natural number) without any problem.

When a specimen of non-coaxial electronic component is measured using the standard test fixture 5A, it is difficult to measure the true value of a scattering coefficient of the specimen. However, there is no question about the presence of the true value, and in the discussion that follows, true values are represented by $S_{21DUT}$, $S_{11DUT}$, etc. The observable measurement value of a specimen measured with the specimen mounted on the standard test fixture 5A includes each of true values $S_{21DUT}$ and $S_{11DUT}$ and a measurement error of the standard test fixture 5A (hereinafter referred to as a standard test fixture error) superimposed on the true value. This is referred to as the standard test fixture value.

Figure 5:
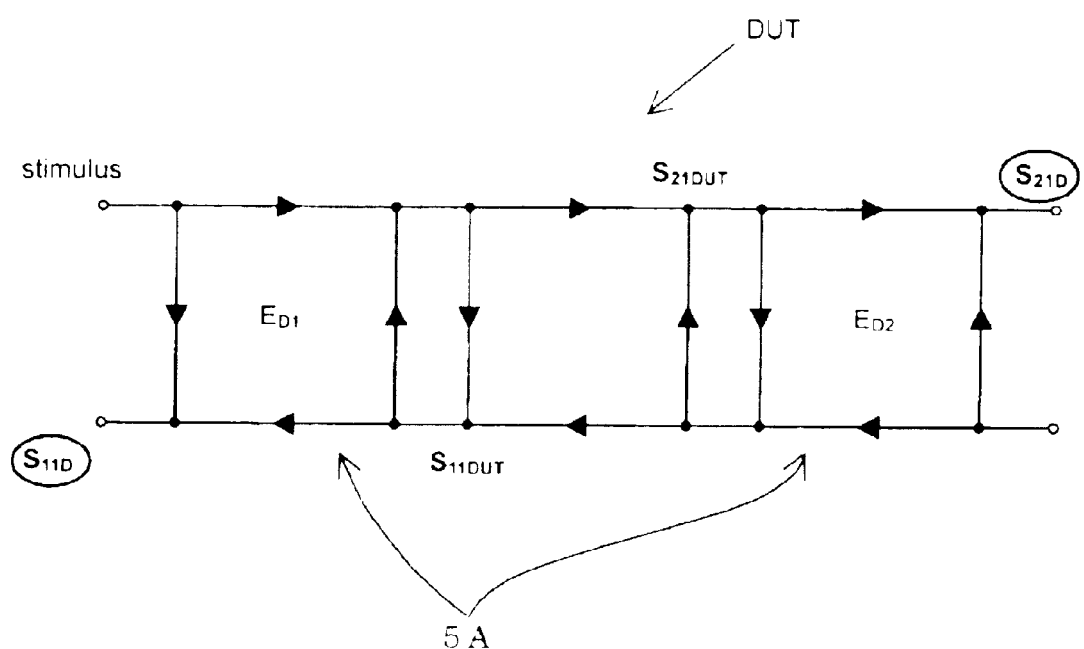
FIG. 5 is a first correction diagram explaining the measurement error correction method of the present invention.

FIG. 5 shows a status of a measurement system. As shown, the specimen itself is referred to as DUT. The standard test fixture measurement values are represented by $S_{21D}$ and $S_{11D}$. The standard test fixture errors are represented by $E_{D1}$ (at an input) and $E_{D2}$ (at an output). As shown, a circle surrounding each of the standard test fixture measurement values $S_{21D}$ and $S_{11D}$ means that the measurement values can be measured. The standard test fixture errors $E_{D1}$ and $E_{D2}$ cannot be identified as the true values of the specimen $S_{21DUT}$ and $S_{11DUT}$ cannot be identified.

Figure 6:
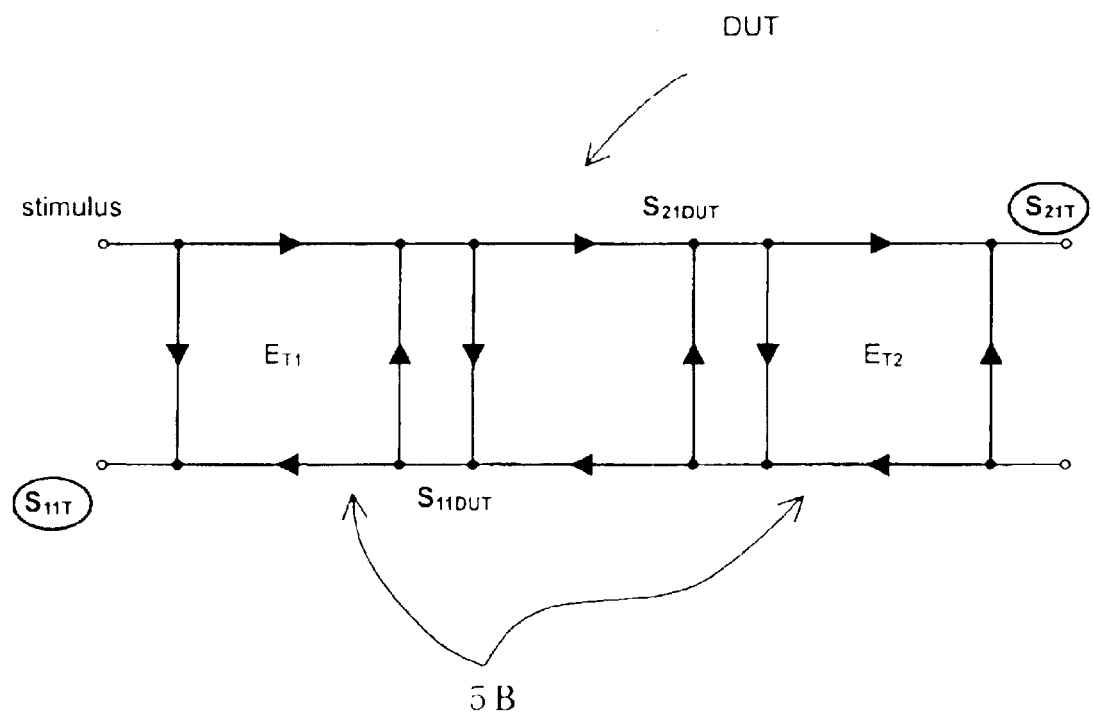
FIG. 6 is a second correction diagram explaining the measurement error correction method of the present invention.

As shown in FIG. 6, the state of measurement in which the DUT identical to the one shown in FIG. 5 is mounted on the production test fixture 5B for measurement is modeled. As long as the same DUT is measured, the true values $S_{21DUT}$ and $S_{11DUT}$ remain unchanged from those measured using the standard test fixture 5A. However, the errors superimposed on the specimen true values $S_{21DUT}$ and $S_{11DUT}$ are the ones attributed to the production test fixture 5B. The measurement values of the characteristics of the DUT measured using the production test fixture 5B are referred to as the production test fixture measurement values $S_{21T}$ and $S_{11T}$. The errors attributed to the production test fixture 5B are referred to as production test fixture errors $E_{T1}$ (at an input) and $E_{T2}$ (at an output). The production test fixture errors $E_{T1}$ and $E_{T2}$ cannot be identified as the standard test fixture errors $E_{D1}$ and $E_{D2}$ cannot be identified.

An error neutralization adapter 30 on which the production test fixture 5B having the DUT mounted thereon is mounted is modeled. The error neutralization adapter 30 in this mounting state is connected to the production measurement apparatus 2. The error neutralization adapter 30 is assumed to have a feature that cancel the production test fixture errors $E_{T1}$ and $E_{T2}$, i.e., removes the errors.

The error neutralization adapter 30 is specifically assumed to be a virtual adapter expressed in two-port scattering coefficients. Scattering coefficient matrices of the production test fixture errors $E_{T1}$ and $E_{T2}$ are transformed into a transmission matrix, and a inverse matrix of the transmission matrix is determined. The inverse matrix is then transformed into a scattering coefficient matrix. Through such matrix transformations, the error neutralization adapter 30 having errors $E_{T1}^{-1}$ and $E_{T2}^{-1}$ is modeled. Although it is impossible to measure the errors $E_{T1}^{-1}$ and $E_{T2}^{-1}$ of the error neutralization adapter 30, the errors $E_{T1}^{-1}$ and $E_{T2}^{-1}$ may be modeled as discussed above.

Figure 7:
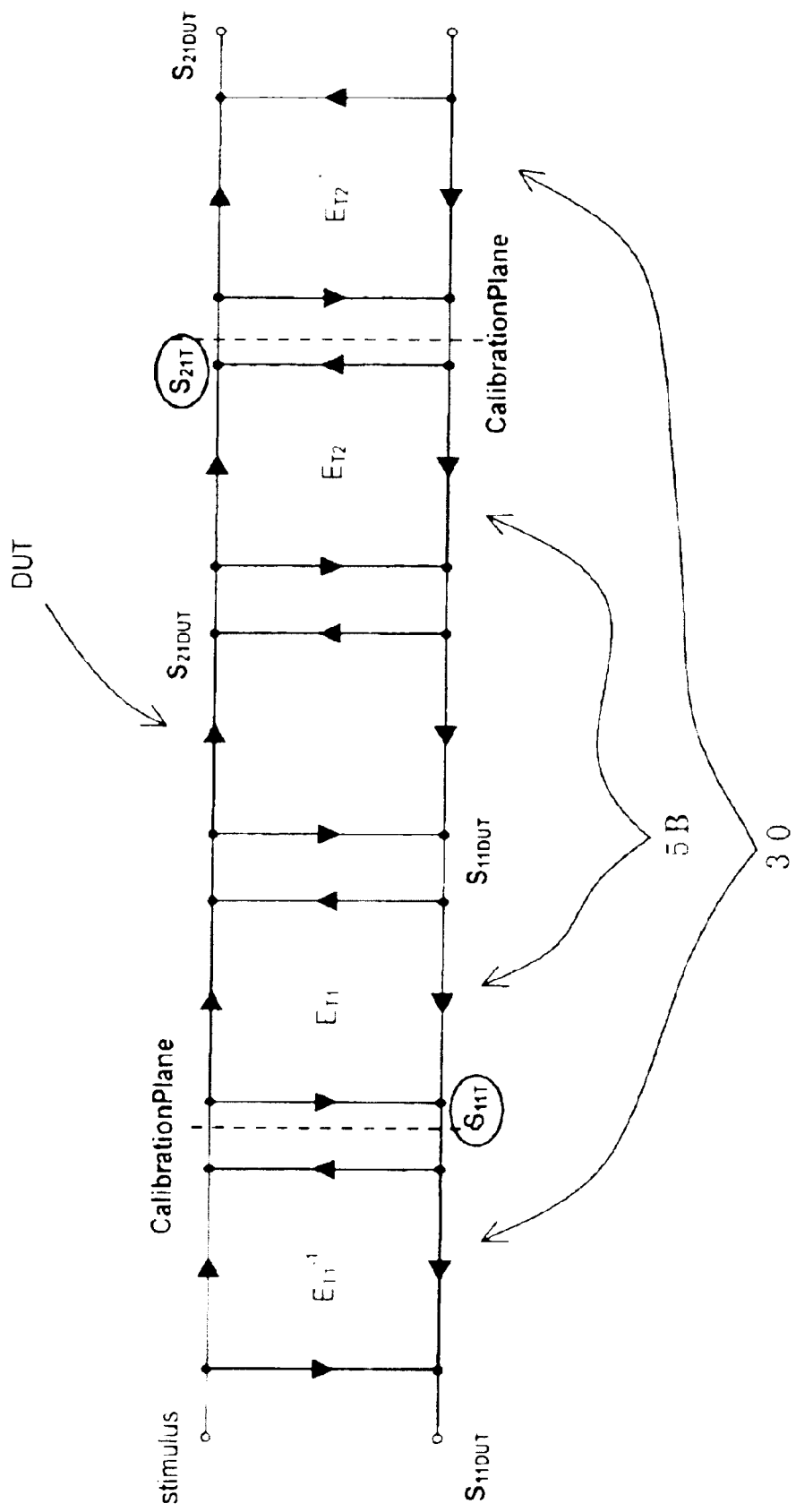
FIG. 7 is a third correction diagram explaining the measurement error correction method of the present invention.

As shown in FIG. 7, the error neutralization adapter 30, on which the production test fixture 5B having the specimen DUT is mounted, is connected to the production measurement apparatus 2, and the measurement of the characteristics of the DUT in this state is modeled. The production test fixture errors $E_{T1}$ and $E_{T2}$ are considered as being canceled by the errors $E_{T1}^{-1}$ and $E_{T2}^{-1}$ of the error neutralization adapter 30. The measurement values of the DUT are then regarded as the specimen true values $S_{21DUT}$ and $S_{11DUT}$.

Figure 8:
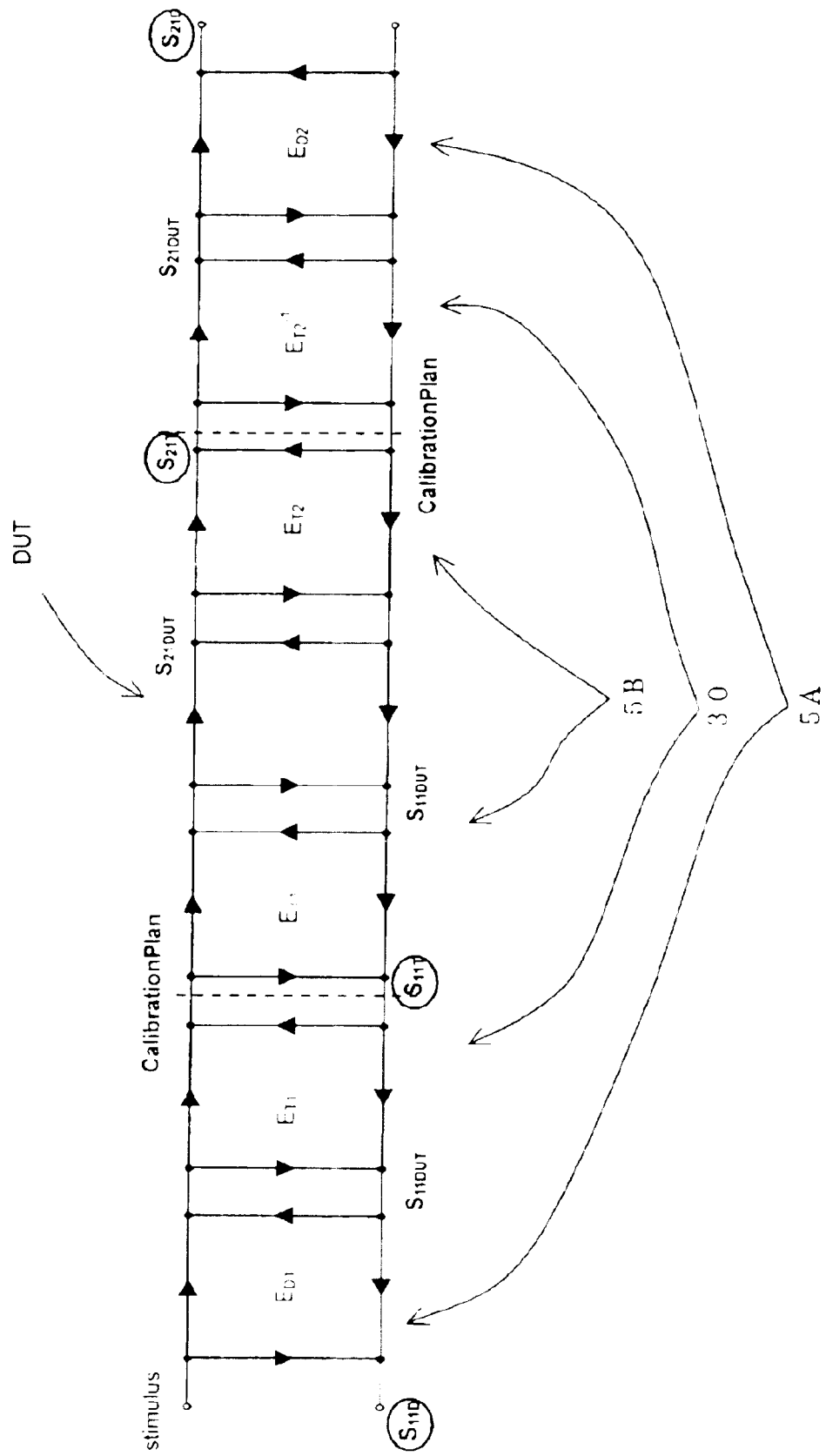
FIG. 8 is a fourth correction diagram explaining the measurement error correction method of the present invention.

FIG. 8 shows a model assuming that the error neutralization adapter 30 having the production test fixture 5B with the DUT thereon is further mounted on the standard test fixture 5A. The standard test fixture 5A in this state is then connected to the production measurement apparatus 2 for measurement. The characteristics at the input and output points of the error neutralization adapter 30 are considered to be the specimen true values $S_{21DUT}$ and $S_{11DUT}$. The characteristics at the input and output points of the standard test fixture 5A are considered to be the standard test fixture measurement values $S_{21D}$ and $S_{11D}$. A model in which the characteristics of the DUT are measured in a state with the production test fixture 5B, the error neutralization adapter 30, and the standard test fixture 5A successively mounted is considered equivalent to a model shown in FIG. 5, wherein the characteristics of the DUT are measured in a state with the standard test fixture 5A mounted on the production measurement apparatus 2.

From the above discussion, if the production test fixture measurement values $S_{21T}$ and $S_{11T}$ are multiplied by the errors $E_{T1}^{-1}$ and $E_{T2}^{-1}$ of the error neutralization adapter 30 and the standard test fixture errors $E_{D1}$ and $E_{D2}$, respectively, the standard test fixture measurement values $S_{21D}$ and $S_{11D}$ may be estimated in the production measurement apparatus 2.

To estimate the standard test fixture measurement values $S_{21D}$ and $S_{11D}$, the specimen true values $S_{21DUT}$ and $S_{11DUT}$, the production test fixture errors $E_{T1}$ and $E_{T2}$, the standard test fixture errors $E_{D1}$ and $E_{D2}$, and the errors $E_{T1}^{-1}$ and $E_{T2}^{-1}$ of the error neutralization adapter must be identified. It is impossible to identify these parameters. The present invention thus models a new state.

Figure 9:
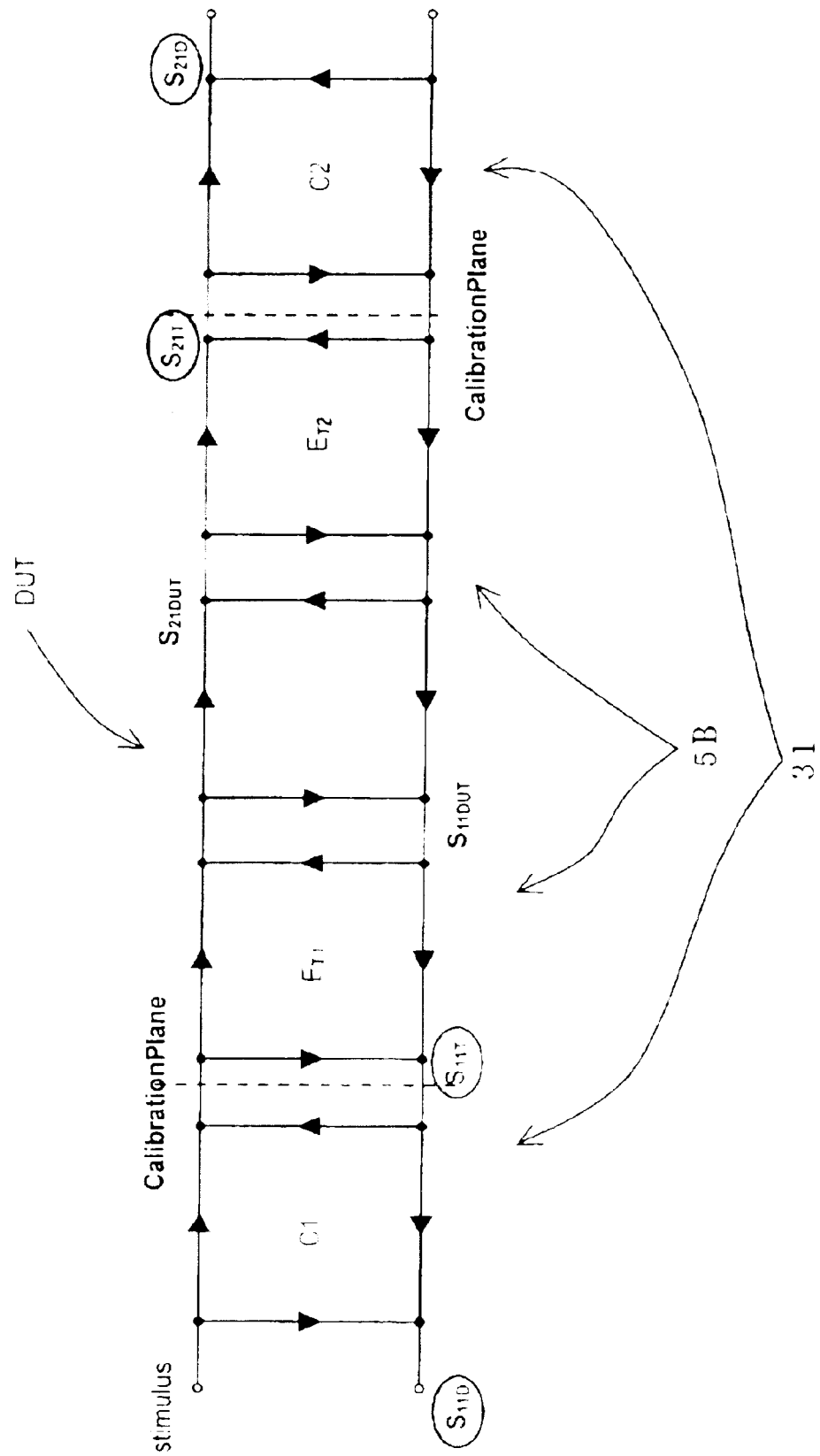
FIG. 9 is a fifth correction diagram explaining the measurement error correction method of the present invention.

In the measurement model shown in FIG. 8, a single adapter shown in FIG. 9 may be assumed by synthesizing the standard test fixture 5A and the error neutralization adapter 30. The newly modeled adapter obtained through synthesis is referred to as a relative correction adapter 31. Errors C1 and C2 attributed to the relative correction adapter 31 are calculated as discussed below. The scattering coefficient matrices of the standard test fixture errors $E_{D1}$ and $E_{D2}$, and the errors $E_{T1}^{-1}$ and $E_{T2}^{-1}$ of the error neutralization adapter 30 are transformed into transmission matrices, and the product of the transmission matrices is determined. The product is then transformed into a scattering coefficient matrix. The errors C1 and C2 of the relative correction adapter 31 are thus calculated.

The DUT is mounted on the relative correction adapter 31, and then the relative correction adapter 31 is mounted on the production test fixture 5B in a model shown in FIG. 9. In the model shown in FIG. 9, a measurement state in which the production measurement apparatus 2 measures the DUT is assumed. Measurement values measured in the assumed measurement state are the standard test fixture measurement values $S_{21D}$ and $S_{11D}$. If the relative correction adapter 31 is assumed, the standard test fixture measurement values $S_{21D}$ and $S_{11D}$ are calculated using the production test fixture 5B but without using the standard test fixture 5A.

The production test fixture measurement values $S_{21T}$ and $S_{11T}$ and the standard test fixture measurement values $S_{21D}$ and $S_{11D}$ are known values that can be obtained through measurement. The number of error factors (unknown number) creating the errors C1 and C2 of the relative correction adapter 31 is finite. If the production test fixture measurement values $S_{21T}$ and $S_{11T}$ and the standard test fixture measurement values $S_{21D}$ and $S_{11D}$ of the DUT (the correction data acquisition specimen) are determined using DUTs of a finite number, the errors C1 and C2 are identified by calculating the error factors contained in the relative correction adapter 31. The error factors of the relative correction adapter 31 can be calculated using one of a variety of methods. One example of calculating the error factors of the relative correction adapter 31 will now be discussed.

To carry out the correction adapter type relative correction method of the present invention, a DUT having an almost negligible transmission coefficient (preferably with a port-to-port transmission coefficient of $-20$ dB) is required.

How small the transmission coefficient of the DUT must be is analyzed as below. When the correction adapter for each port of the test fixture is determined, it is desirable that the measurement value of the reflection coefficient of the DUT at the port is free from the effect of another port. Now, let $-A$ dB represent the transmission coefficient of the DUT, and a measuring signal input to one port of the DUT is attenuated by $-A$ dB when reaching to another port. A portion of the signal reaching the other port is reflected from the other port and is then attenuated by $-A$ dB when reaching the one port. This signal reaching the one port is superimposed on the reflection coefficient of the DUT at the one port. The reflection occurring at the other port at a frequency of several GHz is typically as high as $-20$ dB. With the transmission coefficient of $-20$ dB of the DUT, an error signal of $-60$ dB results with respect to an input signal to the DUT. The error signal is thus 0.1% of the input signal to the DUT, and the effect of the error signal at this level is negligible in most cases. The values quoted here change depending on required calibration accuracy.

Figure 10:
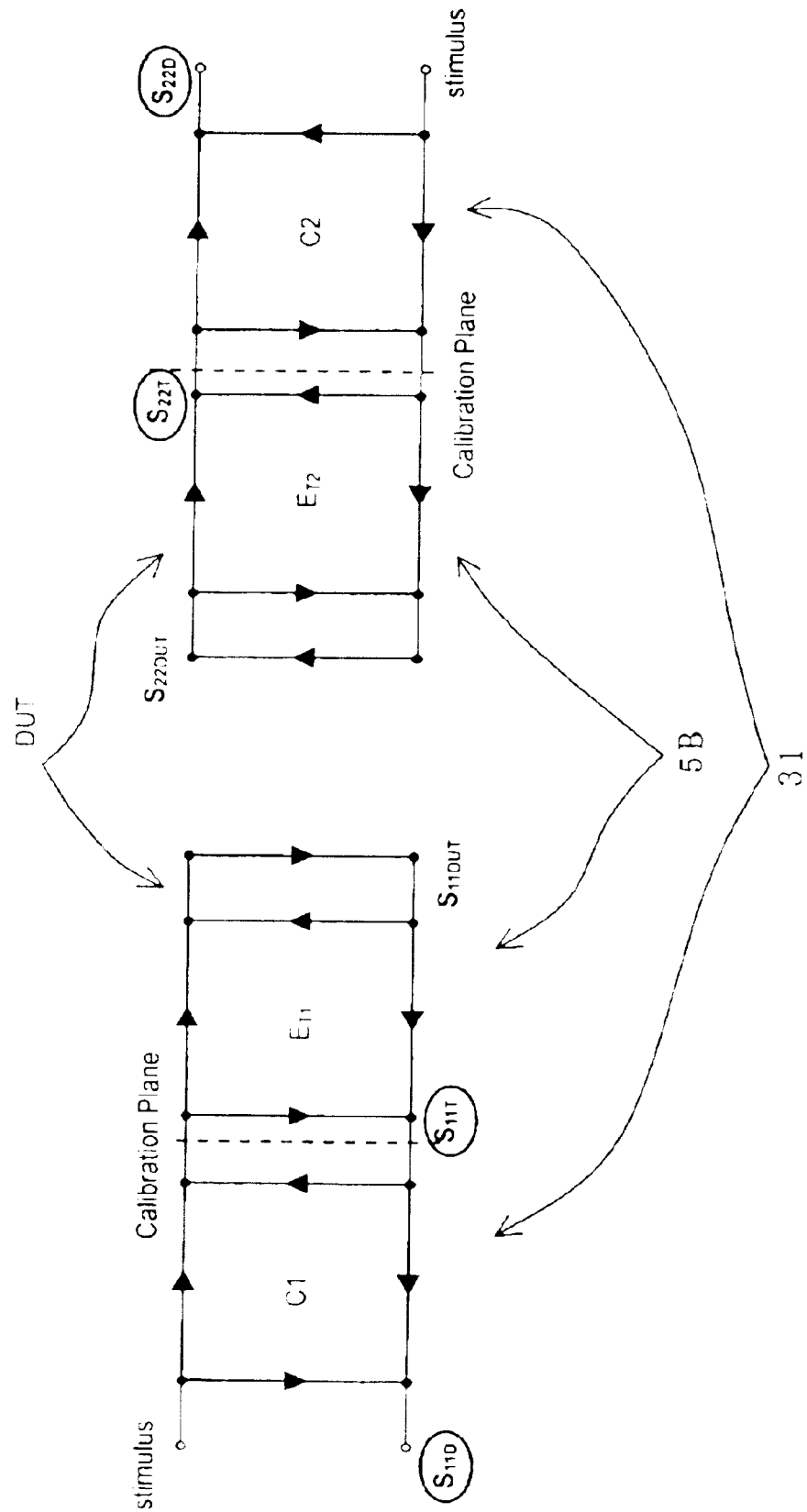
FIG. 10 is a sixth correction diagram explaining the measurement error correction method of the present invention.
Figure 11:
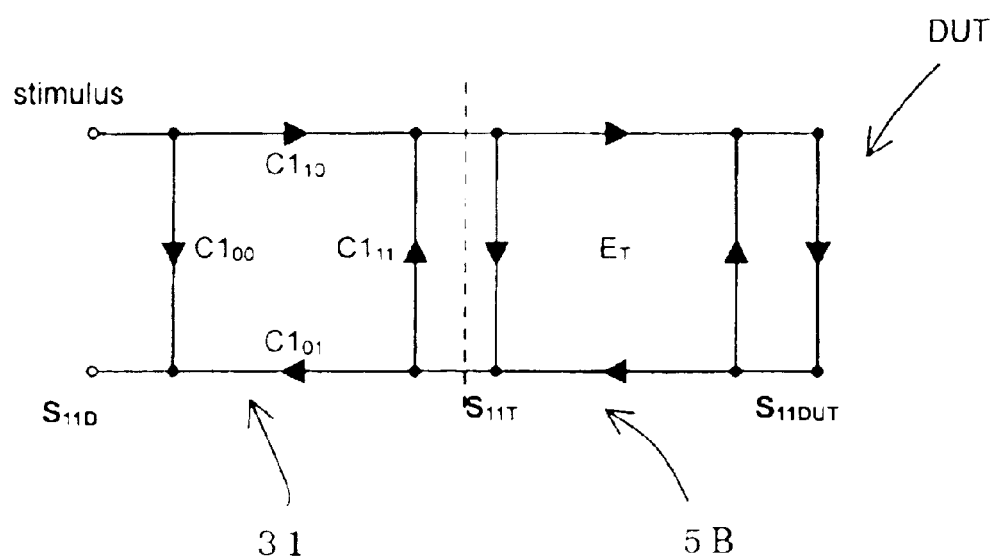
FIG. 11 is a seventh correction diagram explaining the measurement error correction method of the present invention.

Returning to the discussion of the correction adapter type relative correction method, FIGS. 10 and 11 show the state of the relative correction. FIG. 10 shows a whole measurement system of a two-port DUT. FIG. 11 shows in enlargement one port of the DUT having the two ports. In the discussion that follows, a port 1 is discussed from among a plurality of ports.

If viewed from the port (the port 1 in FIGS. 10 and 11), the DUT is regarded as a one-port device. For this reason, error factors $C1_{00}$, $C1_{10}$, $C1_{11}$, and $C1_{01}$ are determined for each port independent of the remaining port. The forward transmission coefficient $C1_{10}$ and the reverse transmission coefficient $C1_{01}$ of the relative correction adapter 31 are equal to each other in accordance with the reciprocity principle. The four error factors of the relative correction adapter 31 are reduced to three independent variables $C1_{00}$, ($C1_{10}=C1_{01}$), and $C1_{11}$. If the production test fixture measurement values $S_{21T}$ and $S_{11T}$ and the standard test fixture measurement values $S_{21D}$ and $S_{11D}$ are obtained for each of the three DUTs, the error factors $C1_{00}$, ($C1_{10}=C1_{01}$), and $C1_{11}$ (such as the transmission coefficient) of the relative correction adapter 31 are identified.

The following equation (1) calculates the error factors of the relative correction adapter 31 that uses the production test fixture measurement values $S_{21T}$ and $S_{11T}$ and the standard test fixture measurement values $S_{21D}$ and $S_{11D}$ measured for the three DUTs (the correction data acquisition specimens 11B). In equation (1), last subscripts $_1$, $_2$, and $_3$ of the subscripts of the production test fixture measurement values $S_{21T}$ and $S_{11T}$ and the standard test fixture measurement values $S_{21D}$ and $S_{11D}$ indicate specimen numbers of the three DUTs (the correction data acquisition specimens 11B).

Equation 1

$$C1_{00} = -(S_{11D1}*S_{11D3}*S_{11T2}*S_{11T} - S_{11D1}*S_{11D2}*S_{11T2}*S_{11T3} - S_{11D2}*S_{11D3}*S_{11T1}*S_{11T3} +$$

$$S_{11D1}*S_{11D2}*S_{11T1}*S_{11T3} + S_{11D2}*S_{11D3}*S_{11T1}*S_{11T2} - S_{11D1}*S_{11D3}*S_{11T1}*S_{11T2})/$$

$$(S_{11D2}*S_{11D3}*S_{11T3} - S_{11D1}*S_{11D3}*S_{11T3} - S_{11D2}*S_{11D3}*S_{11T2} + S_{11D1}*S_{11D2}*S_{11T2} + S_{11D1}*S_{11D3}*S_{11T1} - S_{11D1}*S_{11D2}*S_{11T1})$$

$$C1_{01} = C1_{10} = \pm Sqrt((S_{11D2} - S_{11D1})*(S_{11D3} - S_{11D1})*(S_{11D3} - S_{11D2})*(S_{11T2} -$$

$$S_{11T1})*(S_{11T3} - S_{11T1})*(S_{11T3} - S_{11T2}))/(S_{11D2}*S_{11D3}*S_{11T3} - S_{11D1}*S_{11D3}*S_{11T3} - S_{11D2}*S_{11D3}*S_{11T2} +$$

$$S_{11D1}*S_{11D2}*S_{11T2} + S_{11D1}*S_{11D3}*S_{11T1} - S_{11D1}*S_{11D2}*S_{11T1})C1_{11} =$$

$$((S_{11D2} - S_{11D1})*S_{11T2} + (S_{11D1} - S_{11D3})*S_{11T2} + (S_{11D3} - S_{11D2})**S_{11T1})/$$

$$(S_{11D2}*S_{11D3}*S_{11T3} - S_{11D1}*S_{11D3}*S_{11T3} - S_{11D2}*S_{11D3}*S_{11T2} + S_{11D1}*S_{11D2}*S_{11T2} +$$

$$S_{11D1}*S_{11D3}*S_{11T1} - S_{11D1}*S_{11D2}*S_{11T1}) \quad (1)$$

It is impossible to directly determine signs (of a portion ±Sqrt . . . (Sqrt means square root)) contained in $C1_{01} (= C1_{10})$. If the electrical length of the fixture is physically longer (or shorter) than by a half-wave length, phase rotates by $2\pi$ along a round travel. Even if a reflected wave only is observed, it is impossible to discriminate from the original electrical length. The sign is important in the transmission coefficient, and a correct sign must be determined.

The wavelength of the input signal is typically longer than the electrical length of the standard test fixture 5A in a frequency as low as several GHz in which the present invention finds applications. If the electrical length of the fixtures 5A and 5B is longer than the wavelength, a positive sign is attached; otherwise, a negative sign is attached. No problem occurs in this arrangement. The correction adapter type relative correction method of the present invention is thus carried out.

Likewise, the error factors at a port 2 of the relative correction adapter 31 are identified. The error factors at the ports 1 and 2 thus identified are substituted in the following equation (2). The standard test fixture measurement values $S_{21D}$ and $S_{11D}$ are thus estimated from the production test fixture measurement values $S_{21T}$ and $S_{11T}$.

Equation 2

$$Denom0 = 1 - C1_{11}*S_{11T} - C2_{11}*S_{22T} + C1_{11}*C2_{11}*S_{21T}*S_{12T} + C1_{11}*C2_{11}*S_{11T}*S_{22T}$$

$$S_{11D} = C1_{00} + (C1_{10}*C1_{01}*S_{11T} - C1_{10}*C2_{11}*S_{11T}*S_{22T} +$$

$$C1_{10}*C2_{11}*C1_{01}*S_{21T}*S_{12T})/Denom0 \quad S_{21D} = C1_{10}*C2_{01}*S_{21T}/Denom0$$

$$Denom1 = 1 - C2_{11}*S_{22T} - C1_{11}*S_{11T} - C2_{11}*C1_{11}*S_{12T}*S_{21T} + C2_{11}*C1_{11}*S_{22T}*S_{11T}$$

$$S_{22D} = C2_{00} + (C2_{10}*C2_{01}*S_{22T} - C2_{10}*C2_{01}*C1_{11}*S_{22T}*S_{11T} + C2_{10}*C1_{11}*C2_{01}*S_{12T}*S_{21T})/Denom1 \quad S_{12D} = C2_{10}*C1_{01}*S_{12T}/Denom1 \quad (2)$$

The correction method for estimating the standard test fixture measurement values $S_{21D}$ and $S_{11D}$ from the production test fixture measurement values $S_{21T}$ and $S_{11T}$ in a measurement system having three or more ports will now be discussed. The correction adapter type relative correction method is to solve a linear simultaneous equation containing the production test fixture measurement values $S_{21T}$ and $S_{11T}$ as known constants, and the standard test fixture measurement values $S_{21D}$ and $S_{11D}$ as unknown variables. The number of terms of the linear simultaneous equation is three times the number of ports. The correction adapter type relative correction method is thus implemented by solving the linear simultaneous equation.

The linear simultaneous equation is easily and automatically expressed using a computer algorithm. The correction adapter type relative correction method corresponding to a measurement system having any number of ports is provided by solving the linear simultaneous equation using a typical method such as the LU decomposition (one of solving algorithms of linear simultaneous equation, and a so-called direct method).

This method is applicable regardless of the number of ports of a measurement system, but requires a long calculation time. If the speed of correction process is important, the linear simultaneous equation may be algebraically solved beforehand, and a correction calculation may be performed using the equation. However, the applicability of the correction adapter type relative correction method of the present invention to a multi-port measurement system will be lost.

The solving of the linear simultaneous equation with the production test fixture measurement values $S_{21T}$ and $S_{11T}$ being the known constants and the standard test fixture measurement values $S_{21D}$ and $S_{11D}$ being the unknown variables is equivalent to the calculation in the SOLT calibration. In the correction adapter type relative correction method of the present invention, the SOLT calibration is carried out in the multi-port measurement system. The correction adapter type relative correction method in a measurement system having three or more ports will now be discussed.

The standard test fixture measurement values $S_{21D}$ and $S_{11D}$ are determined in the correction adapter type relative correction method of the present invention as discussed below. The standard test fixture measurement values $S_{21D}$ and $S_{11D}$ are determined as scattering coefficients when the relative correction adapter 31 as a sort of two-port network is connected to each port of a measurement model expressed by the production test fixture measurement values $S_{21T}$ and $S_{11T}$. The correction adapter type relative correction method of the present invention is thus defined as a method for determining the scattering coefficients when the relative correction adapter 31 is connected to the measurement model expressed by the production test fixture measurement values $S_{2IT}$ and $S_{11T}$.

The procedure of calculating the standard test fixture measurement values $E_{[D1]21D}$ and $E_{[D2]11D}$ from the production test fixture measurement values $S_{21T}$ and $S_{11T}$, on the assumption that the relative correction adapter 31 has been available. For convenience of explanation, a two-port measurement model is discussed. The procedure is mechanically expanded to a multi-port measurement model.

Figure 12:
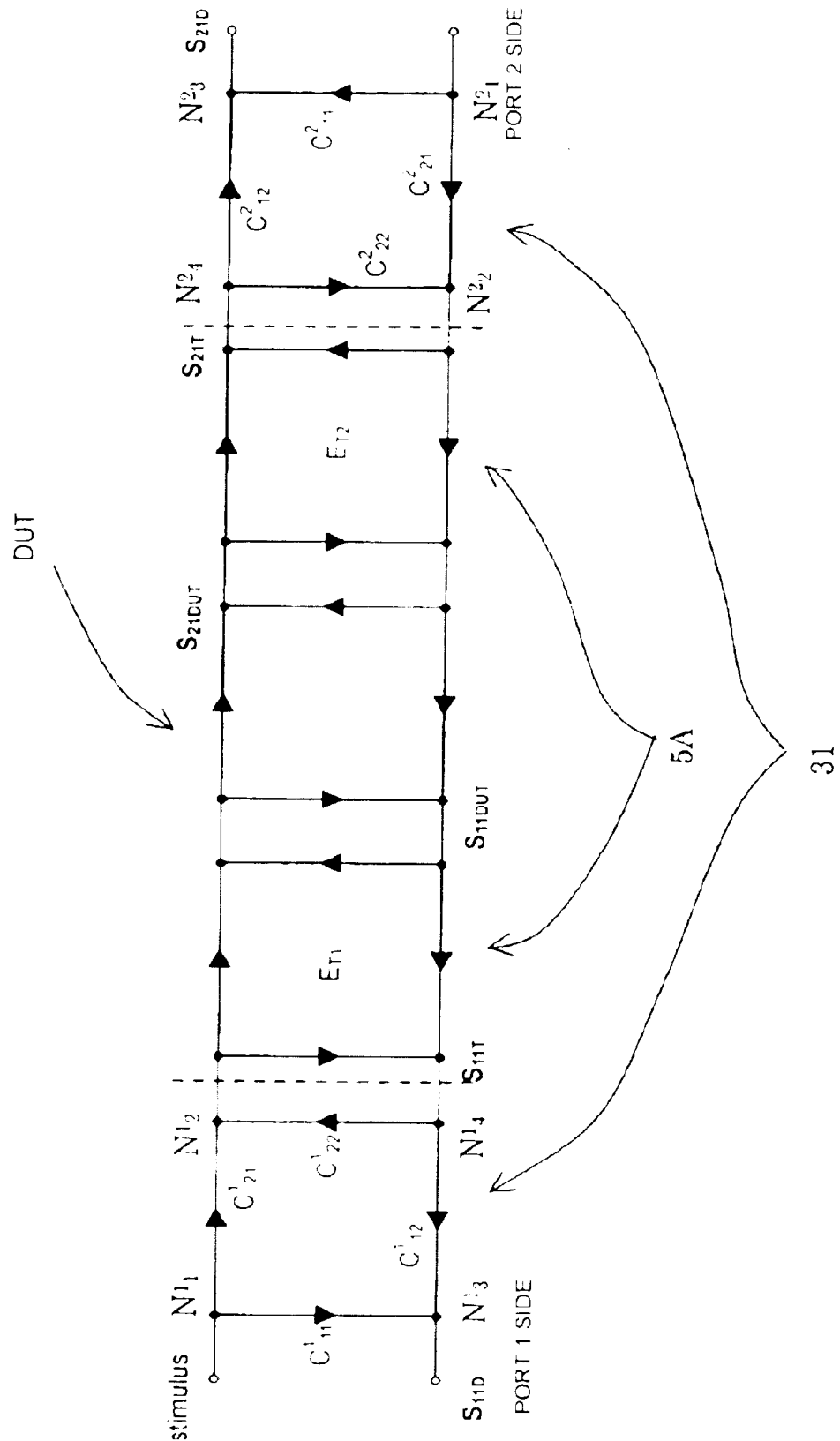
FIG. 12 is an eighth correction diagram explaining the measurement error correction method of the present invention.

FIG. 12 is a forward signal flow diagram in a state that the relative correction adapter 31 is arranged at each port of a measurement model represented by the standard test fixture measurement values $S_{21D}$ and $S_{11D}$. The measurement model shown in FIG. 12 is a version defined more in detail of the model of FIG. 9.

As shown in FIG. 12, $E_{T1}$ and $E_{T2}$ are two-port networks indicating the error factors of each port of the production test fixture 5B. The scattering coefficients becoming the error factors of the two-port networks $E_{T1}$ and $E_{T2}$ are not determined through measurement. $C^1_{11}$, $C^1_{12}$, $C^1_{21}$, and $C^1_{22}$ are coefficients becoming the error factors of the relative correction adapter 31 at the port 1 side. The coefficients $C^1_{11}$, $C^1_{12}$, $C^1_{21}$, and $C^1_{22}$ are determined through calculation. $N^1_1$, $N^1_2$, $N^1_3$, and $N^1_4$ are node values of the relative correction adapter 31 at the port 1 side. $C^2_{11}$, $C^2_{12}$, $C^2_{21}$, and $C^2_{22}$ are coefficients becoming the error factors of the relative correction adapter 31 at the port 2 side. The coefficients $C^2_{11}$, $C^2_{12}$, $C^2_{21}$, and $C^2_{22}$ are determined through calculation. $N^2_1$, $N^2_2$, $N^2_3$, and $N^2_4$ are node values of the relative correction adapter 31 at the port 2 side. $S_{11DUT}$ and $S_{21DUT}$ are scattering coefficients of the DUT. The scattering coefficients $S_{11DUT}$ and $S_{21DUT}$ are not obtained through measurement. $S_{11T}$ and $S_{21T}$ are production test fixture measurement values. The production test fixture measurement values $S_{11T}$ and $S_{21T}$ are measured using a measurement apparatus. $S_{11D}$ and $S_{21D}$ are standard test fixture measurement values that are estimated through the correction adapter type relative correction method.

In the signal flow diagram shown in FIG. 12, each node value is a sum of signals input from adjacent nodes. The input is considered as a product of the node value of an adjacent node and a coefficient of a signal transmission line.

As shown, a node $N^1_3$ receives signals from a node $N^1_1$ and a node $N^1_4$. The signals from the node $N^1_1$ and the node $N^1_4$ are respectively multiplied by $C^1_{11}$ and $C^1_{12}$ before reaching the node $N^1_3$. The following equation (3) holds at the node $N^1_3$.

$$N^1_3 = C^1_{11} N^1_1 + C^1_{12} N^1_4 \tag{3}$$

A similar relationship holds at each node. If such relationships are formulated, the following group (4) of equations results. The following group (4) of equations is mechanically determined for each port. The formulation of similar equations for n ports using a computer-based process is easily performed. The left column of the group (4) of equations corresponds to those for the port 1 and the right column of the group (4) of equations corresponds to those for the port 2. The two columns are identical to each other except the port number, and even if the number of ports increases, equations automatically formulated using the computer algorithm.

$$N^1_2 = C^1_{21} N^1_1 + C^1_{22} N^1_4 \quad N^2_2 = C^2_{21} N^2_1 + C^2_{22} N^2_4 \, N^1_3 = C^1_{11} N^1_1 + C^1_{12} N^1_4 \, N^2_3 = C^2_{11} N^2_1 +$$

$$C^2_{12} N^2_4 N^1_4 = S_{11T} N^1_2 + S_{12T} N^2_2 \, N^2_4 = S_{22T} N^2_2 + S_{21T} N^1_2 \tag{4}$$

Known as a constant are discussed below. In the forward measurement, a signal source output at the port 1 is regarded as 1. A signal input at the port 2 is regarded as 0. In this way, conditions expressed in equation (5) results.

Equation 5

$$\begin{pmatrix} N^1_1 \\ N^2_1 \end{pmatrix} = \begin{pmatrix} 1 \\ 0 \end{pmatrix} \tag{5}$$

The following equation (6) holds between unknown numbers (the standard test fixture measurement values $S_{21D}$ and $S_{11D}$) and each node.

Equation 6

$$\begin{pmatrix} S_{11D} \\ S_{21D} \end{pmatrix} = \begin{pmatrix} N^1_3 \\ N^2_3 \end{pmatrix} \tag{6}$$

Equations (4)–(6) are linear simultaneous equations. Here, the number of unknowns is equal to the number of equations. The standard test fixture measurement values $S_{11D}$ and $S_{21D}$ as the unknowns are determined by solving the linear simultaneous equations. Any method for solving the linear simultaneous equations using a computer may be used. Since the number of terms of the equations is not so large, a direct method such as the LU decomposition easily solves the equations.

The calculation method of calculation the standard test fixture measurement values $S_{11D}$ and $S_{21D}$ in the forward measurement has been discussed. To determine the standard test fixture measurement values $S_{11D}$ and $S_{21D}$ in the reverse measurement, the equation group (4) is used as is but equation (7) and equation (8) are substituted for equation (5) and equation (6), respectively, calculating constant conditions and unknowns.

Equation 7

$$\begin{pmatrix} N^1_1 \\ N^2_1 \end{pmatrix} = \begin{pmatrix} 0 \\ 1 \end{pmatrix} \tag{7}$$

Equation 8

$$\begin{pmatrix} S_{22D} \\ S_{12D} \end{pmatrix} = \begin{pmatrix} N^2_3 \\ N^1_3 \end{pmatrix} \tag{8}$$

The two-port measurement system has been discussed. In an n-port system, linear simultaneous equations are automatically formulated and then solved easily using the computer algorithm. In this way, the correction adapter type relative correction method is implemented in a multi-port measurement system.

In the method discussed above, the standard test fixture measurement values $S_{21D}$ and $S_{11D}$ are determined as the scattering coefficients when the relative correction adapter 31 is mounted on the measurement model represented by the production test fixture measurement values $S_{21T}$ and $S_{11T}$. Mathematically, the equation group (4) is solved with the production test fixture measurement values $S_{21T}$ and $S_{11T}$ considered as the known constants and the standard test fixture measurement values $S_{21D}$ and $S_{11D}$ considered as the unknown variables.

Conversely, the equation group (4) is solved with the standard test fixture measurement values $S_{21D}$ and $S_{11D}$ considered as known constants and the production test fixture measurement values $S_{21T}$ and $S_{11T}$ considered as unknown variables. In this case, the production test fixture measurement values $S_{21T}$ and $S_{11T}$ are handled as a true value of the DUT, the standard test fixture measurement values $S_{21D}$ and $S_{11D}$ are handled as an observed value of the measurement apparatus, and the true value of the DUT is determined from the observed value of the measurement apparatus. This process is fully identical to the process of the SOLT calibration. The relative correction adapter 31 corresponds to an error model in the SOLT calibration.

In accordance with the above method, the SOLT calibration is carried out by solving simultaneous equations. The simultaneous equations are formulated by applying the following equation (9) to equation (4) and by applying the following equation (10) to equation (4). The SOLT calibration identifies $S_{11T}$, $S_{21T}$, $S_{12T}$, and $S_{22T}$ as unknowns.

$S_{12T}$ and $S_{22T}$ are production test measurement values of a transmission coefficient and a reflection coefficient in reverse direction, although not shown. These correspond to $S_{21T}$ and $S_{22T}$ in the forward measurement.

Equation 9

$$\begin{pmatrix} N_1^1 \\ N_3^1 \\ N_1^2 \\ N_3^2 \end{pmatrix} = \begin{pmatrix} 1 \\ S_{11D} \\ 0 \\ S_{21D} \end{pmatrix} \quad (9)$$

Equation 10

$$\begin{pmatrix} N_1^2 \\ N_3^2 \\ N_1^1 \\ N_3^1 \end{pmatrix} = \begin{pmatrix} 1 \\ S_{22D} \\ 0 \\ S_{12D} \end{pmatrix} \quad (10)$$

As discussed above, these linear simultaneous equations are easily formulated and solved using the computer algorithm in the measurement system having an arbitrary number of ports. The SOLT calibration is thus carried in the n-port measurement system.

The error factor (such as scattering coefficients) in the SOLT calibration is determined as below. Three DUTs different in characteristics are prepared. Measurement values at each port of each DUT are known. Three error factors (error coefficients) of directivity, source matching, and reflection tracking are determined to correct one port. When the correction of the one port is completed, two error factors (error coefficients) of load matching and transmission tracking of another port are determined. The error factors (the scattering coefficients) are thus determined in the SOLT calibration.

The correction adapter type relative correction method becomes effective when a measurement system having five or more ports. In particular, the correction adapter type relative correction method is effective when the number of ports substantially increases in a balanced measurement if considered in terms of the number of equivalent unbalanced ports.

The correction adapter type relative correction method of the present invention is now discussed with reference to actual measurement results. The principal measurement conditions are as follows:

Electronic component under test 11A (DUT): unbalanced input-balanced output SAW filter (fn=1842.5 MHz). Three normal electronic components and two faulty electronic components of SAW filter are prepared as the electronic component 11A under test.

Correction data acquisition specimen 11B: Chip components are directly soldered onto SMA connectors with one of a substantially opened terminal, a substantially shorted terminal, and a terminated terminal. Three correction data acquisition specimens 11B are thus prepared.

Standard test fixture 5A: A fixture manufactured by KMM on which the electronic component 11A under test (DUT) is to be mounted is prepared.

Production test fixture 5B: Prepared as the production test fixture 5B is the above-mentioned fixture having a calibration plane thereof as error factors wherein a 50 cm long coaxial cable is connected to a port 1, a 30 mm long adapter is connected to a port 2, and an attenuator of −3 dB is connected to a port 3.

Apparatuses such as the standard measurement apparatus 1 and the production measurement apparatus 2: R3860 (4-port network analyzer with a frequency range to 8 GHz) manufactured by ADVANTEST. One of the apparatuses connected to the standard test fixture 5A works as the standard measurement apparatus 1, and another apparatus connected to the production test fixture 5B works as the production measurement apparatus 2.

Frequency range: 1650 MHz–2050 MHz
Number of pieces of data: 401
IF bandwidth: 1000 Hz (without averaging process)
Measurement Method:

1. The three correction data acquisition specimens 11B are respectively mounted on the standard test fixtures 5A. The standard test fixture 5A with the specimen 11B mounted thereon is connected to the measurement apparatus for measurement. The measurement apparatus here is regarded as the standard measurement apparatus 1. Measurement values here are standard test fixture measurement values $S_{21D}$ and $S_{11D}$ of the correction data acquisition specimen 11B.

2. Likewise, the three correction data acquisition specimens 11B are respectively mounted on the production test fixture 5B. The production test fixture 5B with the correction data acquisition specimen 11B mounted thereon is connected to the above-mentioned measurement apparatus. The measurement apparatus is regarded as the production measurement apparatus 2. Measurement values here are production test fixture measurement value $S_{21T}$ and $S_{11T}$ of the correction data acquisition specimen 11B.

3. The measurement results of the correction data acquisition specimen 11B, namely, the standard test fixture measurement values $S_{21D}$ and $S_{11D}$ and the production test fixture measurement value $S_{21T}$ and $S_{11T}$, are substituted for the previously mentioned equation (1) to calculate the error factors of the relative correction adapter 31.

4. The electronic components 11A are respectively mounted on the standard test fixture 5A. The standard test fixture 5A with the electronic component 11A mounted thereon is connected to the above-mentioned measurement apparatus for measurement. The measurement apparatus is regarded as the standard measurement apparatus 1. The measurement values are the standard test fixture measurement values $S_{21D}$ and $S_{11D}$ of the electronic component 11A.

5. Likewise, the electronic components 11A are respectively mounted on the production test fixture 5B. The production test fixture 5B with the electronic component 11A mounted thereon is connected to the above-mentioned measurement apparatus. The measurement apparatus is regarded as the production measurement apparatus 2. Measurement values here are production test fixture measurement value $S_{21T}$ and $S_{11T}$ of the electronic component under test 11A.

6. The standard test fixture measurement values $S_{21D}$ and $S_{11D}$ of the electronic component 11A are estimated by substituting the production test fixture measurement value $S_{21T}$ and $S_{11T}$ of the electronic component under test 11A in the previously mentioned equation (2).

Figure 13:
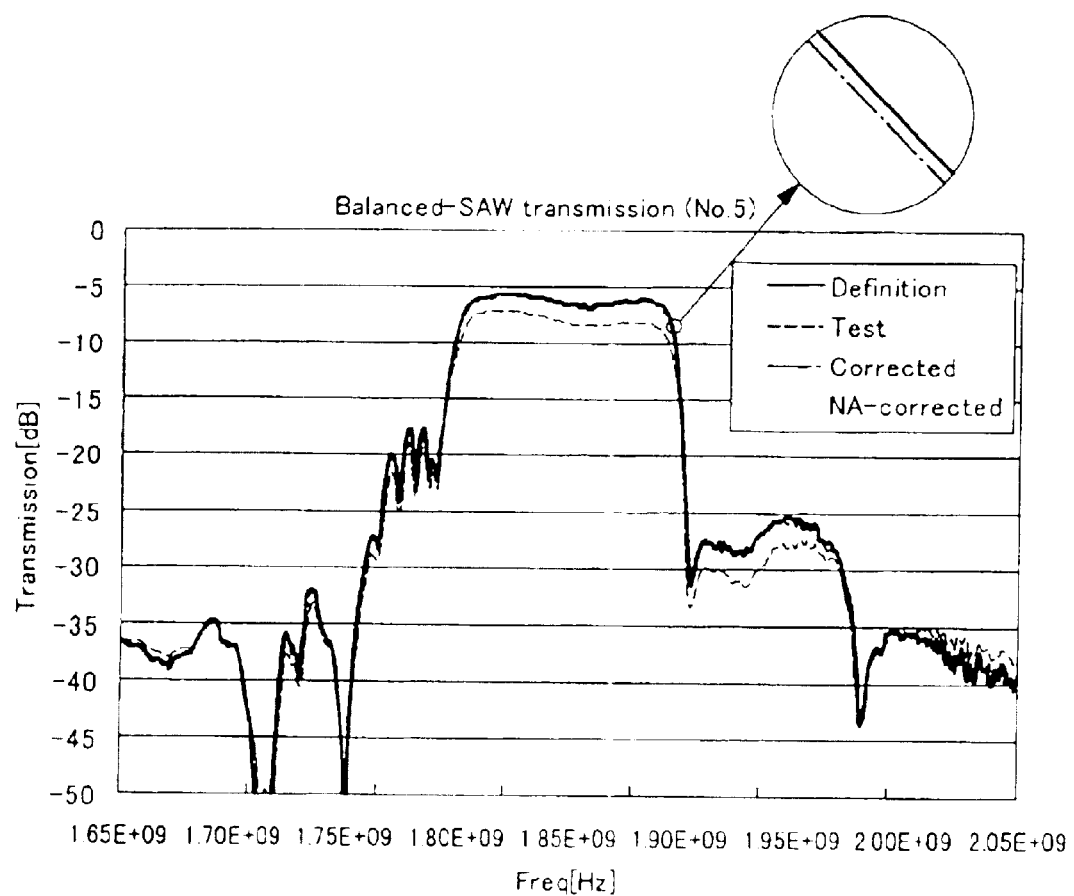
FIG. 13 is a first plot showing correction results provided by the measurement error correction method of the present invention.
Figure 14:
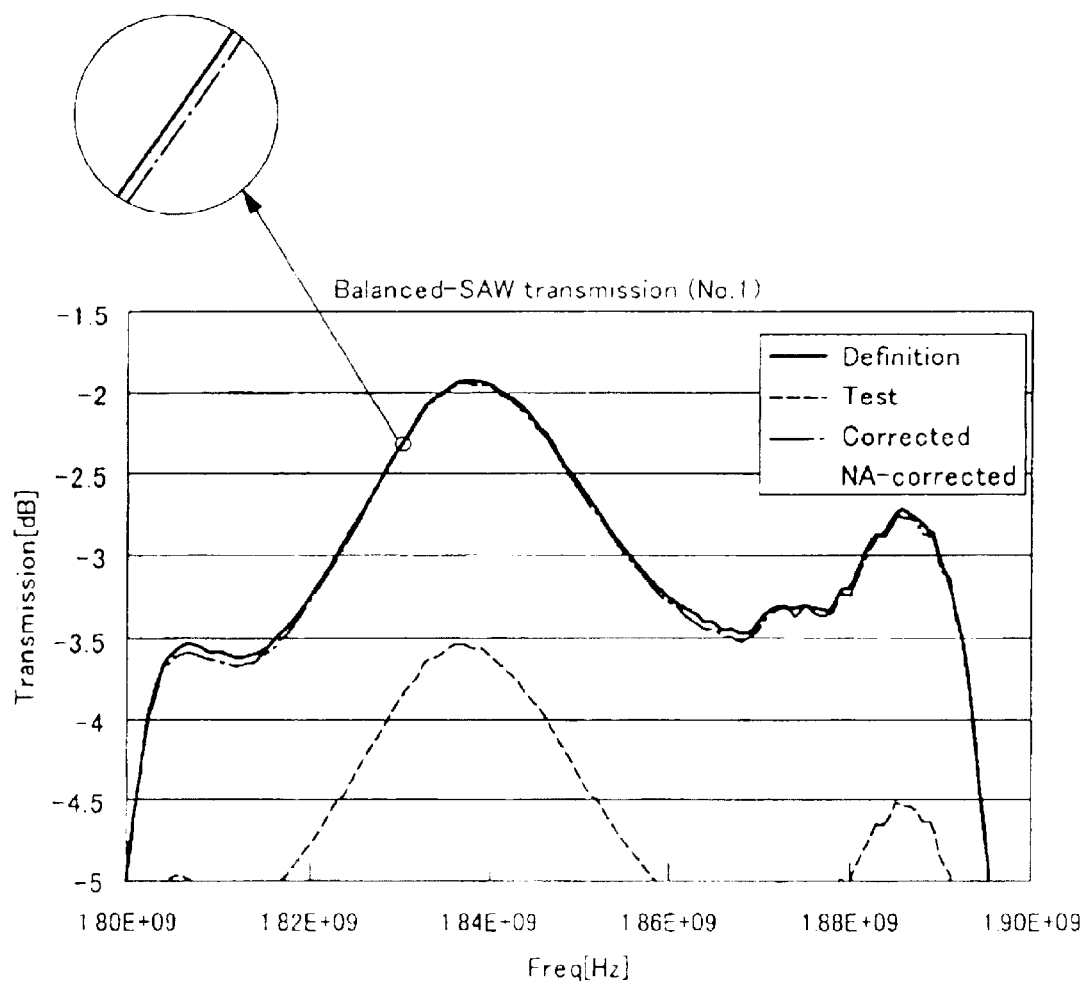
FIG. 14 shows in enlargement a major portion of the first plot of FIG. 13.

FIGS. 13 and 14 shows correction results of transmission coefficient (Sds21) of the nondefective electronic component under test 11A. FIG. 13 shows a response in the entire frequency range from 1650 MHz to 2050 MHz, and FIG. 14 shows in enlargement a major portion of the response shown in FIG. 13. As shown, a definition line represents the standard test fixture measurement values $S_{21D}$ and $S_{11D}$, a test line represents production test fixture measurement value $S_{21T}$ and $S_{11T}$, and a corrected line represents relative corrected results. If the test line is corrected into the corrected line to coincide with the definition line, the correction adapter type relative correction method is considered to work.

As distinctly seen from FIGS. 13 and 14, the production test fixture measurement value $S_{21T}$ and $S_{11T}$ are greatly different from the standard test fixture measurement values $S_{21D}$ and $S_{11D}$ because of the effect of variations in error among fixtures. The results of correction of the test fixture measurement value $S_{21T}$ and $S_{11T}$ using the correction adapter type relative correction method of the present invention precisely match the standard test fixture measurement values $S_{21D}$ and $S_{11D}$. This shows that the correction adapter type relative correction method of the present invention performs precise correction.

Figure 15:
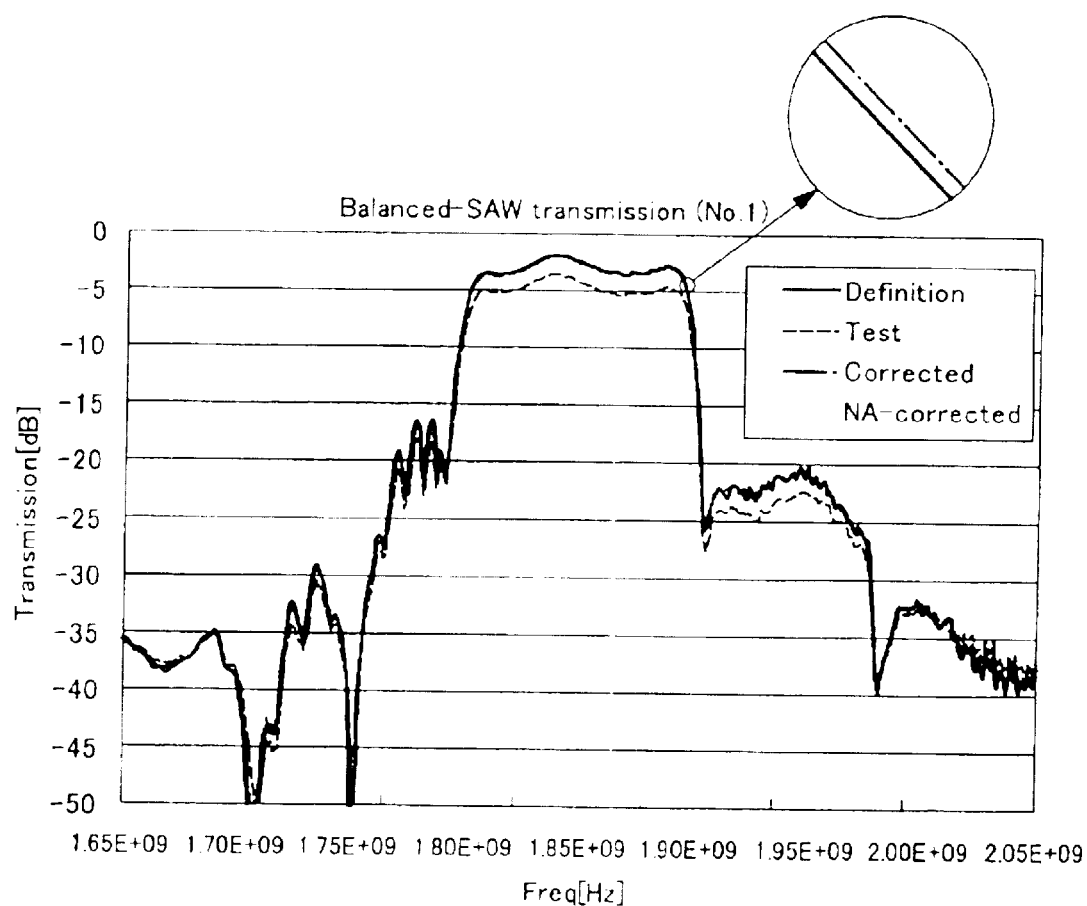
FIG. 15 is a second plot showing correction results provided by the measurement error correction method of the present invention.
Figure 16:
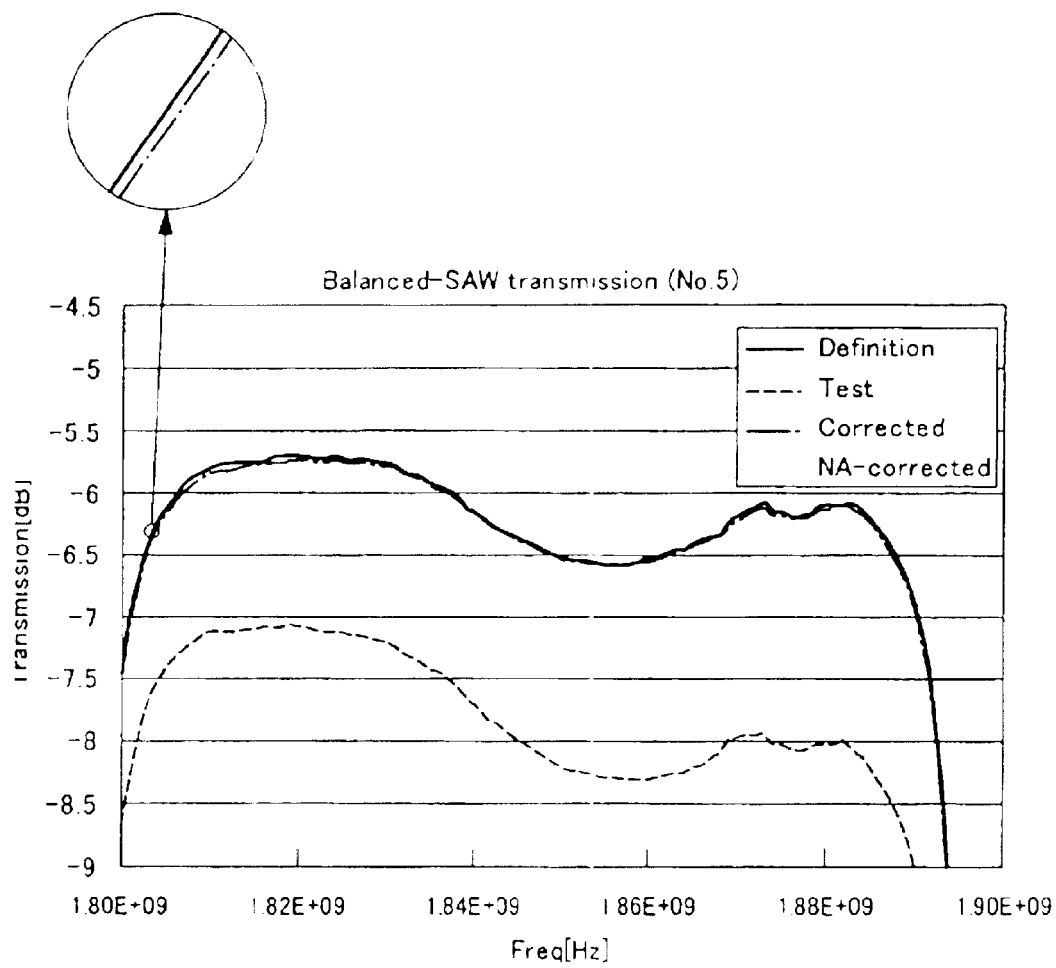
FIG. 16 shows in enlargement a major portion of the second plot of FIG. 15.

FIGS. 15 and 16 show correction results of transmission coefficients (Sds21) of the faulty electronic components 11A. FIG. 15 shows a response in the entire frequency range from 1650 MHz to 2050 MHz, and FIG. 16 shows in enlargement a major portion of the response shown in FIG. 15. As long as the characteristics of the specimens remain linear, the correction adapter type relative correction method of the present invention is performed without paying attention to the characteristics of the specimen. Precise correction is carried out on the faulty electronic component under test 11A.

Figure 17:
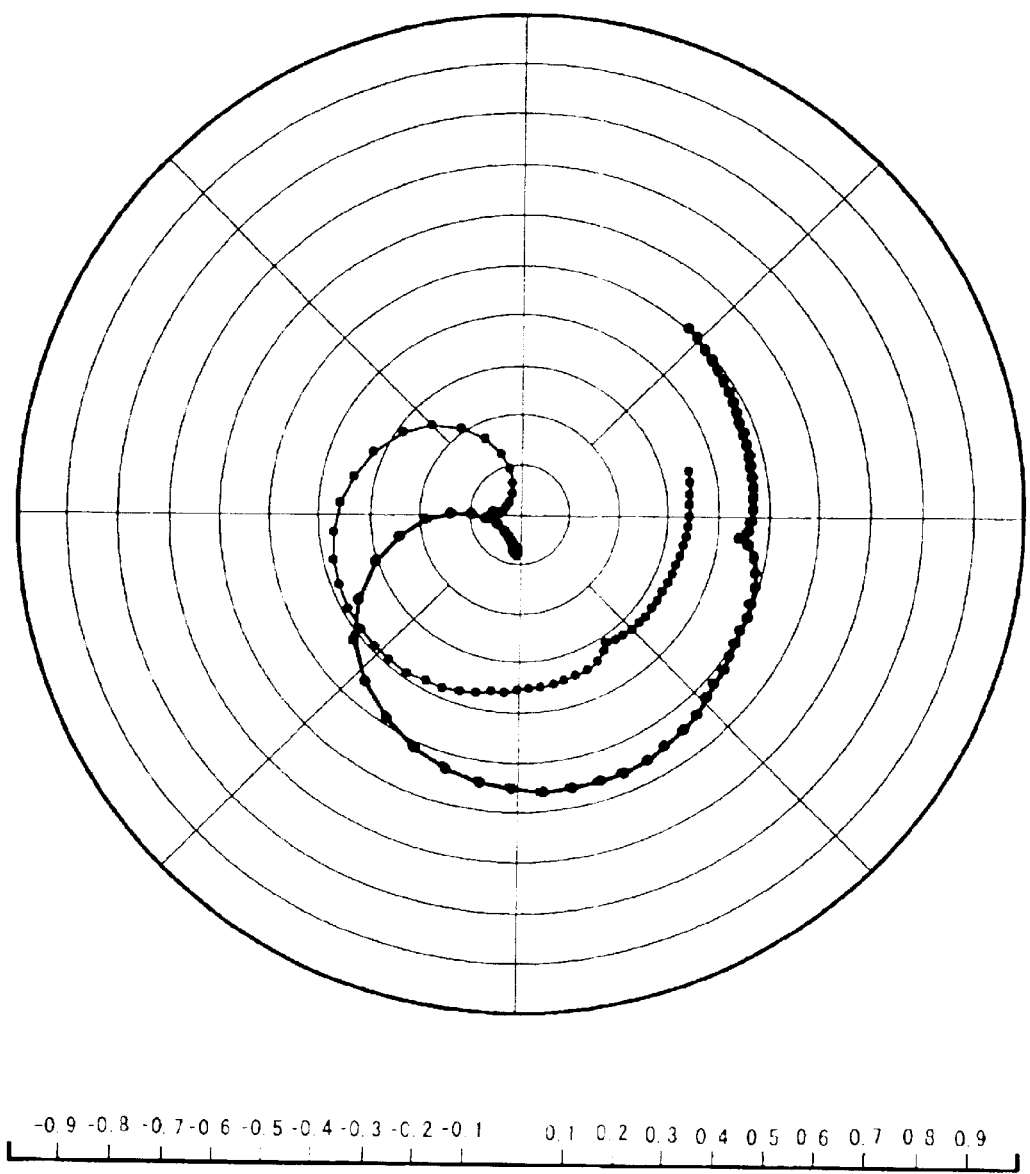
FIG. 17 is a third plot showing correction results provided by the measurement error correction method of the present invention.

FIG. 17 shows correction results of an unbalanced transmission coefficient (Sss31) in the vicinity of a passband of the nondefective electronic component under test 11A. The correction results are represented in polar coordinates. A differential signal between two unbalanced ports is input across balanced ports. No normal correction of the balanced ports is expected simply based on a mere right correction of the amplitude of the signal. In addition to the correction of the amplitude, phase must also be correctly corrected.

Since the attenuator is connected to the port 3, the test fixture measurement value $S_{21T}$ and $S_{11T}$ have amplitude greatly attenuated in comparison with the standard test fixture measurement values $S_{21D}$ and $S_{11D}$ (by 3 dB). The test fixture measurement value $S_{21T}$ and $S_{11T}$ rotate in phase because of the electrical length thereof. In the corrected results, amplitude and phase are re-created normally.

Figure 18:
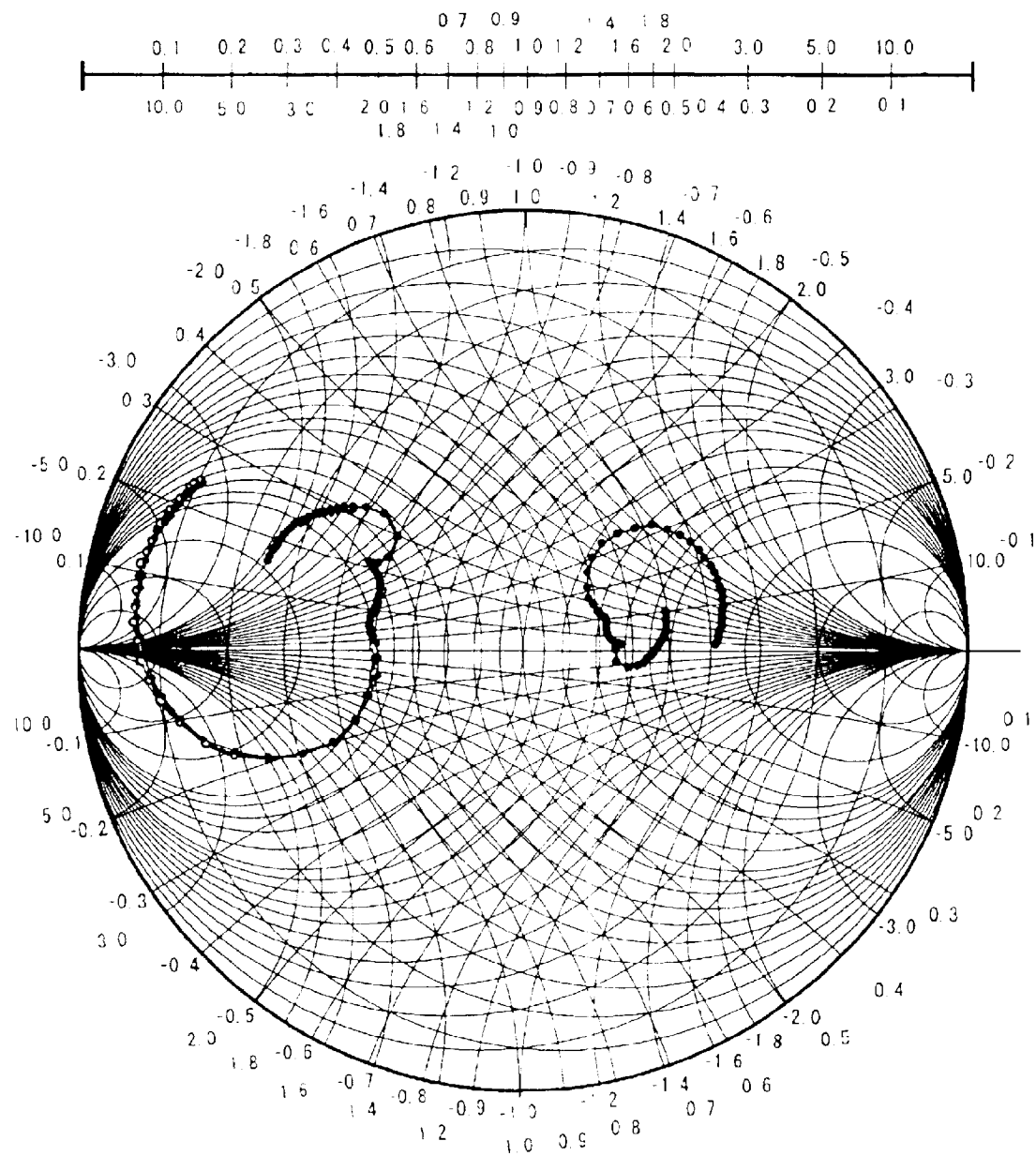
FIG. 18 is a fourth plot showing correction results provided by the measurement error correction method of the present invention.

FIG. 18 shows corrected results of a reflection coefficient (Sss33) in the vicinity of a passband of the (normal) electronic components 11A. Good corrected results are obtained in the reflection coefficient if the correction adapter type relative correction method of the present invention is performed.

The correction data acquisition specimen 11B for use in the correction adapter type relative correction method of the present invention will now be discussed.

To perform the correction adapter type relative correction method of the present invention, the correction data acquisition specimen 11B having a port-to-port transmission coefficient as close to zero as possible (preferably equal to or lower than −20 dB) is required. To form such a correction data acquisition specimen 11B, port to port insulation of the correction data acquisition specimen 11B must be as high as possible. Shielding between ports is contemplated to increase the port to port insulation. The shielding complicates the structure of the correction data acquisition specimen 11B, leading to a cost increase.

Figure 19:
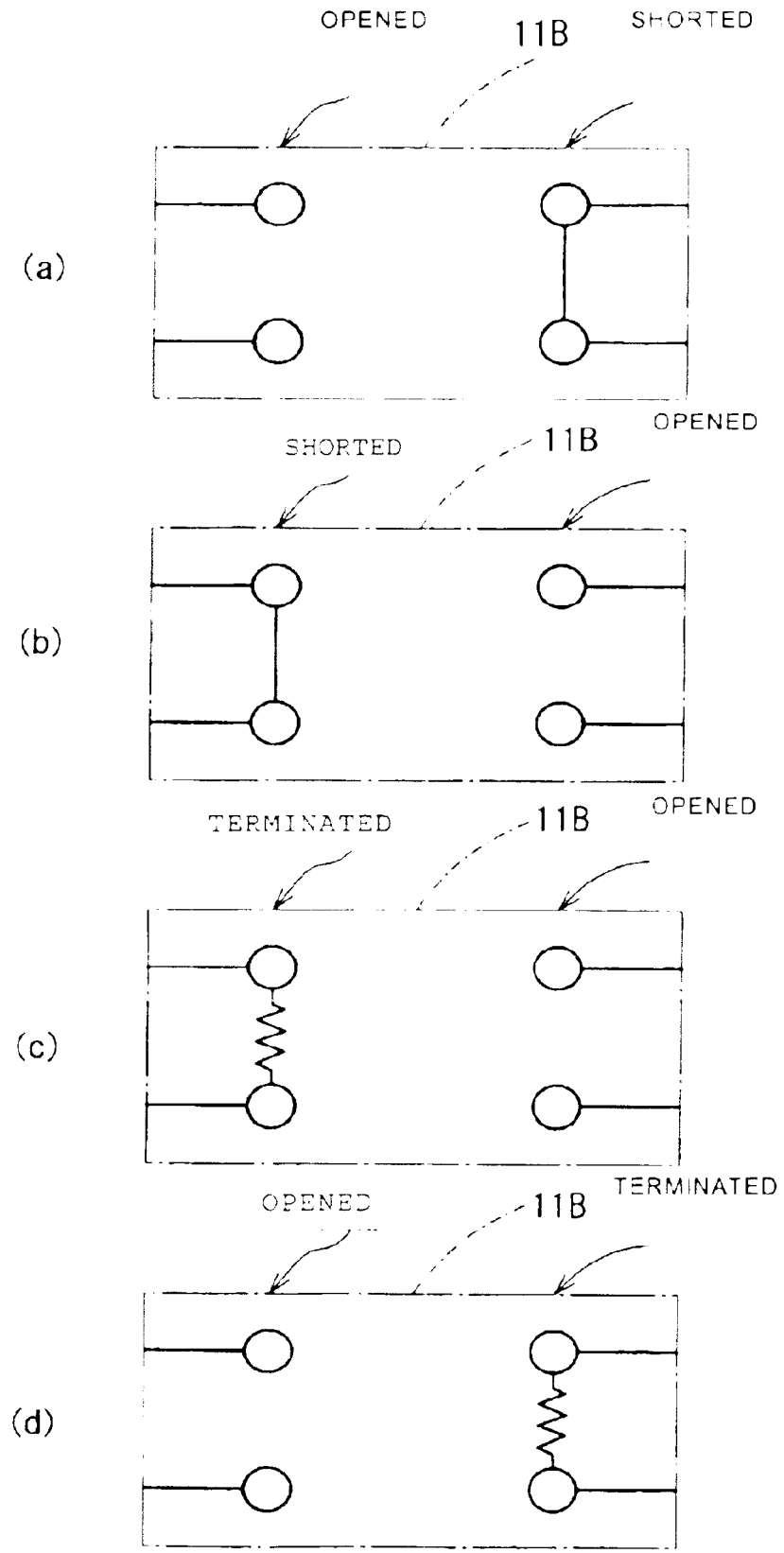
FIG. 19 shows the structure of a correction data acquisition specimen appropriate for use in the measurement error correction method of the present invention.

When the correction data acquisition specimen 11B is formed of an element having a tight capacitive coupling or a tight inductive coupling, a transmission mode causing leakage between ports is determined by the shape of the correction data acquisition specimen 11B. For example, the following characteristics are obtained if the correction data acquisition specimen 11B is formed of an element having a tight electromagnetic coupling. If both ports are put into a shorted state, insulation between the two ports is substantially decreased. If one port is put into a shorted state while the other being in an opened state, insulation characteristics between the two ports is kept high because the port at the opened state is not magnetically coupled. As shown in FIGS. 19(a) and 9(b), one of the three correction data acquisition specimens 11B has the setting with an opened port and a shorted port, and another correction data acquisition specimen 11B has the setting with a shorted port and an opened port. As is the case with a combination of opened port and opened port+shorted port and shorted port conventionally performed, a combination of opened port and shorted port+shorted port and opened port can be used. Without affecting the correction procedure, the correction adapter type relative correction method of the present invention is thus performed.

A termination (of 50Ω) may be used as the correction data acquisition specimen 11B. In this case, insulation may be decreased if a setting of a terminated port and a terminated port is arranged. If a setting of terminated port and opened port is arranged, insulation characteristics between the two ports is kept high. As shown in FIGS. 19(c) and 19(d), one of the correction data acquisition specimens 11B has a setting of opened port and terminated port, and another has a setting of terminated port and opened port. As is the case with a combination opened port and opened port+terminated port and terminated port conventionally performed, a combination of opened port and terminated port+terminated port and opened port can be used. Without affecting the correction procedure, the correction adapter type relative correction method of the present invention is thus performed. In this case, however, the required number of correction data acquisition specimens 11B increases by one, totaling four. Since the measurement of the opened port has been completed in the another correction data acquisition specimen 11B, the data for the opened port here is discarded. The same is true if a reflecting end (such as 100 Ω or 10Ω) other than the termination is used.

When the correction data acquisition specimen 11B is formed of an electronic component (LTCC device) having a multi-layer structure, it is difficult to manufacture a termination (of 50Ω) even if an opened port or a shorted port is easily manufactured.

In such a case, a delay line may be used instead of a resistor element for the termination. The end of the delay line may be either an opened end or a shorted end. Depending on the inserted delay line, the correction data acquisition specimen 11B is preferably designed so that reflected waves are shifted in steps of regular phases mutually. In such an arrangement, the correction data acquisition specimens 11B are deviated mutually from each other in characteristics, and measurement is less subject to the effect of error. Specifically, when both the opened port and the shorted port are required, an arrangement of delay lines of 90° phase and 270° phase is preferred. This is to provide a 0° phase for the opened port and 180° for the shorted port. When three delay lines are required, a 0° phase delay line for the opened port, a 120° phase delay line, and a 240° phase delay line are appropriate.

The delay line is manufactured of a conductor pattern only. The correction data acquisition specimen 11B having a delay line is easily produced as an LTCC device (a low temperature co-fired ceramic device). It is difficult to manufacture a correction data acquisition specimen 11B requiring a resistor element such as a termination (of 50Ω) of a LTCC device. Even if manufactured, such a correction data acquisition specimen 11B becomes costly.

If a delay line is arranged for each port of a correction data acquisition specimen 11B having at least two ports, insulation may decrease. A decrease in insulation may be prevented by arranging a structure in which one port is provided with a delay line with the other port opened or shorted.

If the correction data acquisition specimen 11B is thus constructed, the port to port transmission coefficient becomes extremely small. As a result, a correction data acquisition specimen 11B having a high degree of port to port isolation is obtained. The calibration accuracy of the correction adapter type relative correction method of the present invention is thus heightened.

A variation in voltage takes place at the opened port while no current flows at all there. For this reason, an electric field wave travels from the opened port to the shorted port. At the shorted port, a current flows (a magnetic field wave is received), and no variations in voltage occur (no electric field wave is received). After all, no coupling takes place between the ports, thereby resulting in a high degree of isolation. The same is true in a reversed construction.

The termination is typically 50Ω, and both an electric field wave and a magnetic field wave reaches the other end. If the effect of the electric field wave is large because of the structure of the correction data acquisition specimen 11B, the other end may be shorted. If the effect of the magnetic field wave is large, the other end may be opened. The port to port transmission coefficient is minimized in this arrangement. The same is true of a termination having a resistance other than 50Ω.

A correction data acquisition specimen 11B having the port thereof terminated and the port thereof opened and another correction data acquisition specimen 11B having the port thereof shorted and the port thereof opened are manufactured. The two correction data acquisition specimens 11B, each having the opened end at the port 2, are thus arranged. In this arrangement, no normal relative correction can be carried out. In this case, another correction data acquisition specimen 11B having the port thereof opened and the port thereof terminated may be produced. The measurement data of the correction data acquisition specimen 11B at the port 2 prevents data duplication. The same is true of a measurement system having three or more ports.

A modification of the embodiment will now be discussed. The modification relates to a method of correcting measurement results with precision when a gain is measured in a common-emitter amplifier circuit in which a bipolar transistor as an active electronic component under test is used.

Figure 20:
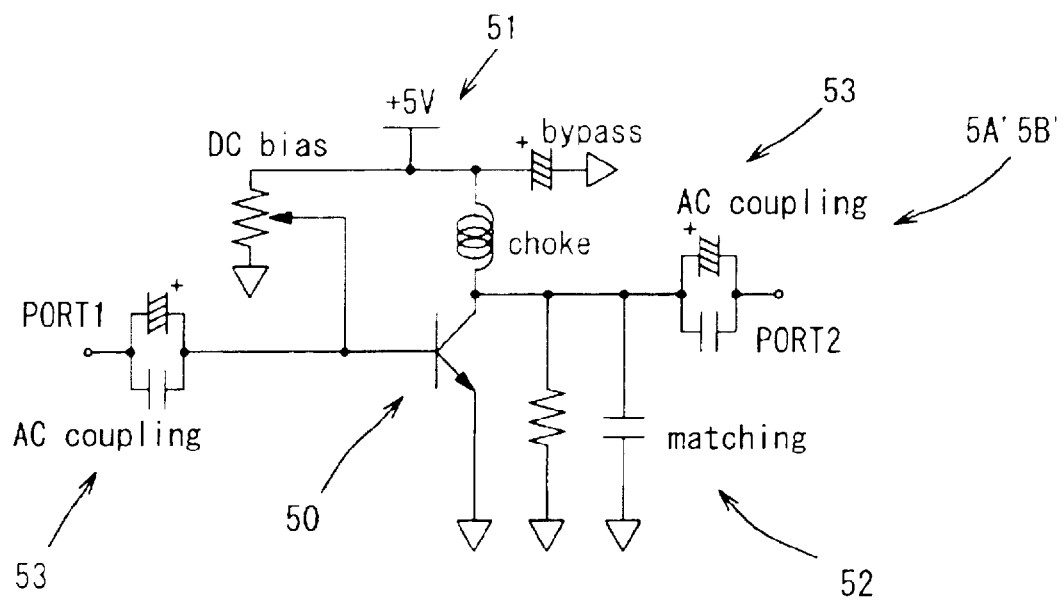
FIG. 20 is a circuit diagram showing one example of fixture used in a modification of an embodiment of the present invention.

FIG. 20 is a circuit diagram showing the structure of a production test fixture 5B' and a standard test fixture 5A'. As shown, a bipolar transistor 50 as an (active) electronic component under test is included. Each of the production test fixture 5B' and the standard test fixture 5A' includes a circuit 51 for supplying a DC voltage to drive the bipolar transistor 50, a circuit 52 for performing impedance matching with the bipolar transistor 50, and a coupling circuit 53 for blocking a DC voltage from an external circuit and for allowing a AC current only to pass therethrough. In this modification, a DC power supply is formed of the circuit 51 to drive the bipolar transistor 50.

Figure 21:
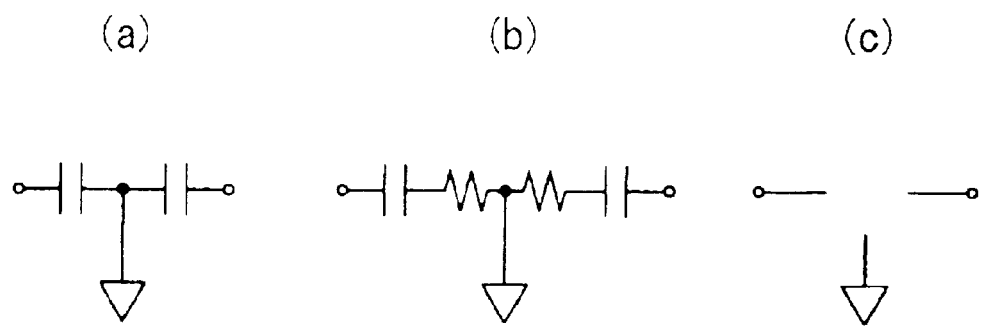
FIG. 21 is a circuit diagram showing a correction data acquisition specimen used in the modification of the embodiment of the present invention.

Measurement is performed with connection coaxial cables 4A and 4B respectively arranged on unshown measurement apparatuses (such as network analyzers) 1 and 2 connected to fixtures 5A and 5B. FIG. 21 is a circuit diagram showing the structure of the correction data acquisition specimen 11B'. FIG. 21(a) shows a shorted specimen 11B', FIG. 21(b) shows a terminated specimen 11B', and FIG. 21(c) shows an opened specimen 11B'. Like the active electronic component under test, the correction data acquisition specimens 11B' are produced to be mountable on the production test fixture 5B' or the standard test fixture 5A'.

The correction method of the error in the modification thus constructed is discussed below. The standard test fixture measurement values $S_{21D}$ and $S_{11D}$ and the production test fixture measurement values $S_{21T}$ and $S_{11T}$ of the correction data acquisition specimen 11B' are measured with three correction data acquisition specimens 11B respectively mounted on each of the standard test fixtures 5A' and the production test fixture 5B'. During measurement, the DC voltage supply circuit 51 supplies each correction data acquisition specimen 11B with a DC voltage at the same level. The standard test fixture measurement values $S_{21D}$ and $S_{11D}$ and the production test fixture measurement values $S_{21T}$ and $S_{11T}$, as the electrical characteristics of each correction data acquisition specimen 11B', are measured under that state. A DC current supply circuit may be arranged instead of the DC voltage supply circuit 51, and during measurement, each correction data acquisition specimen 11B' is supplied with a DC current at the same level by the DC current supply circuit. The DC current supply forms a DC current power supply. A DC current power supply such as the DC current supply circuit 51 may be included in the fixture circuit or may be arranged external to the fixture (for example, may be arranged in each of the measurement apparatuses 1 and 2).

The relative correction adapter 31 is identified based on the standard test fixture measurement values $S_{21D}$ and $S_{11D}$ and the production test fixture measurement values $S_{21T}$ and $S_{11T}$. The relative correction adapter 31 is an adapter which estimates the standard test fixture measurement values $S_{21D}$ and $S_{11D}$ from the production test fixture measurement values $S_{21T}$ and $S_{11T}$. The correction method of the preceding embodiment identifies the relative correction adapter 31. Electrical characteristics of the (active) electronic component under test 11A' are measured with the (active) electronic component under test 11A mounted on the production test fixture 5B'. The DC voltage supply circuit 51 supplies each active electronic component under test 11A' with a DC voltage at the same level.

The standard test fixture measurement values $S_{21D}$ and $S_{11D}$ of the active electronic component under test 11A are calculated from the obtained production test fixture measurement values $S_{21T}$ and $S_{11T}$ and the relative correction adapter 31. Specific test conditions are listed as below.

(Active) electronic component under test: low-frequency small-signal processing general purpose NPN transistor (Product ID No. 2SC1815 manufactured by Toshiba).

Measurement frequency: 1 MHz–3 MHz

Test Instrument: 8753 ES (manufactured by Agilent Technologies)

Signal source output: −15 dBm

Fixtures: standard test fixture 5A' and production test fixture 5B' having the circuit arrangement shown in FIG. 20. The standard test fixture 5A' is adjusted for a gain as large as possible (a choke coil and a capacitor in a matching circuit 62 are adjusted). The production test fixture 5B' is adjusted for a slightly decreased gain by appropriately shifting the circuit from the above state (with L value slightly reduced by widening a width of the choke coil and the capacitance of the capacitor slightly deviated from the above state).

Correction data acquisition specimens: three three-terminal correction data acquisition specimens 11B' are used as shown in FIG. 21.

Correction method: As shown in FIG. 20, the emitter is directly grounded in the (active) electronic component under test 11A'. A relative correction method for a two-port electronic component under test out of the correction methods of the present invention is used.

Figure 22:
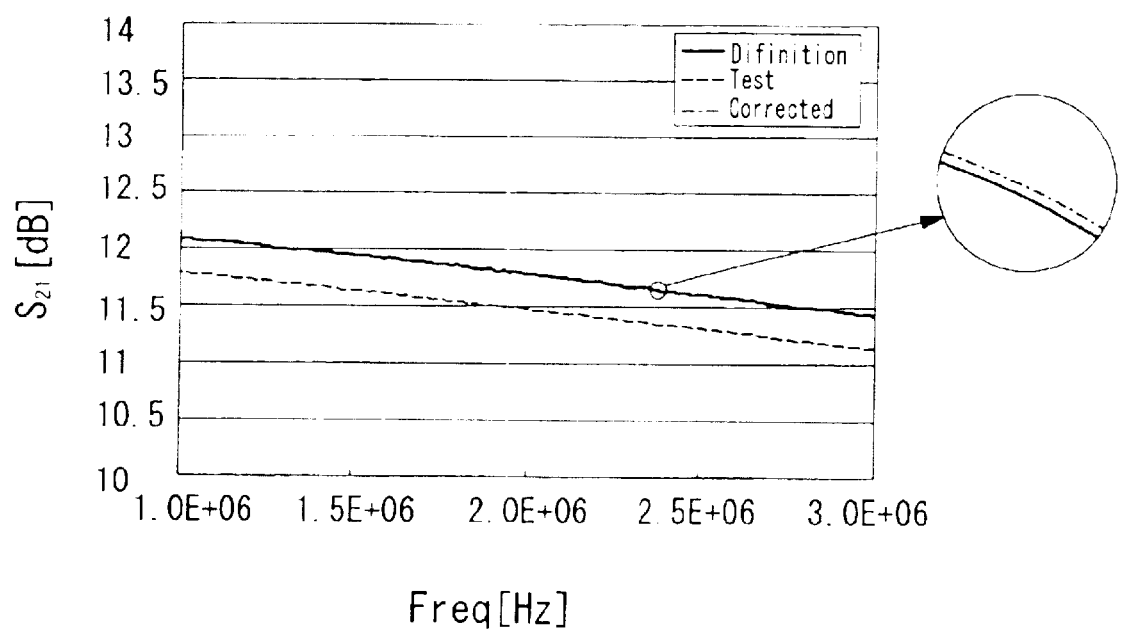
FIG. 22 is a fifth plot showing correction results provided by the measurement error correction method of the modification.

FIG. 22 shows the standard test fixture measurement values $S_{21D}$ (definition line), the production test fixture measurement values $S_{21T}$ (test line), and the corrected results (corrected line) of the forward transmission coefficient (so-called gain). The production test fixture measurement values $S_{21T}$ and $S_{11T}$ are lower than the standard test fixture measurement values $S_{21D}$ and $S_{11D}$ by about 0.5 dB in gain. The relative correction corrects the difference.

Figure 23:
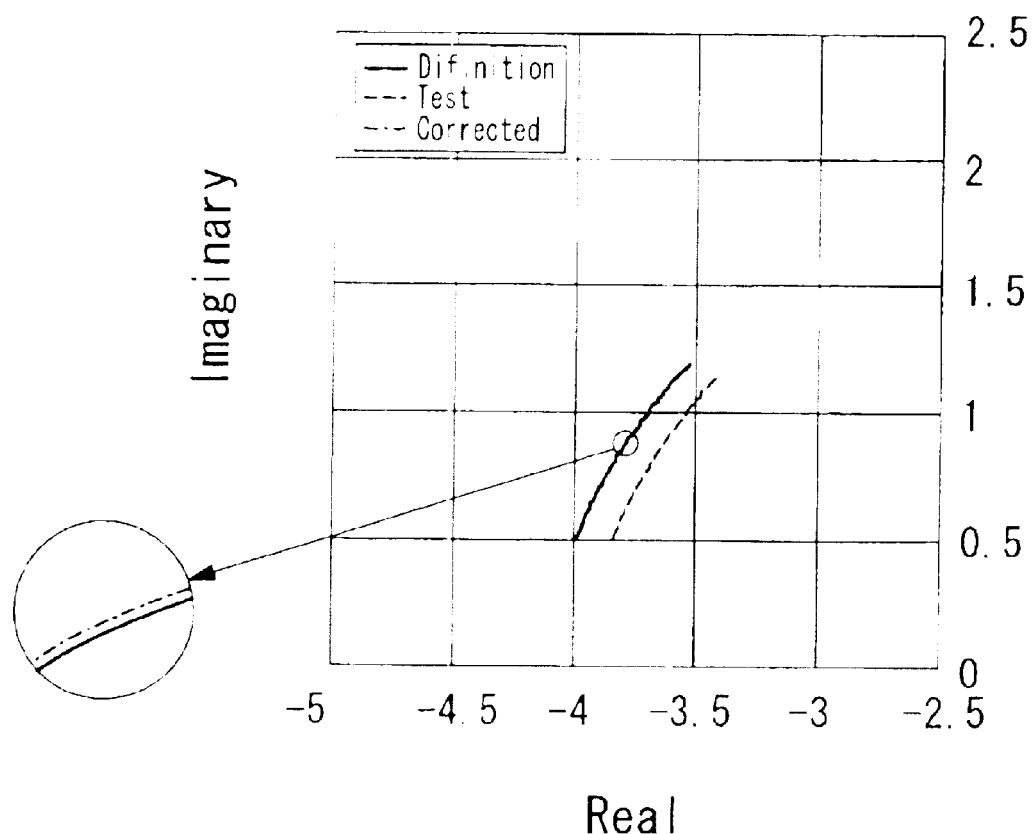
FIG. 23 is a sixth plot showing correction results provided by the measurement error correction method of the modification of the embodiment of the present invention.

FIG. 23 shows the forward transmission coefficient in the polar coordinates. As shown, corrections including correction to phase are correctly performed.

In accordance with the modification, the production test fixture measurement values $S_{21T}$ is caused to coincide with the standard test fixture measurement values $S_{21D}$ with a high precision in active electronic components such as a bipolar transistor, an FET, and an amplifier containing these devices. Without the need for an adjustment procedure of the production test fixture 5B', which could be time consuming even to a skilled person, the standard test fixture measurement value $S_{21D}$ is estimated from the production test fixture measurement value $S_{21T}$ with a high precision. This not only eliminates the need for a fixture adjustment operation, but also the need for a margin between an accept-reject threshold value in bulk production process and a value guaranteed to users. The margin is conventionally required because the measurement results fully coinciding with the standard test fixture measurement value $S_{21D}$ are not obtained even subsequent to the fixture adjustment. Accordingly, production yield increases.

The reason why the modification corrects the measurement value of the active electronic component under test with a high precision is discussed below. For convenience of explanation, a common-emitter amplifier circuit formed of a bipolar transistor is discussed. As the FET, the bipolar transistor is a typical basic element as a semiconductor amplifier component. It is obvious that any one measurement method applicable to the bipolar transistor finds applications in the measurement of other complex active electronic components.

Figure 24:
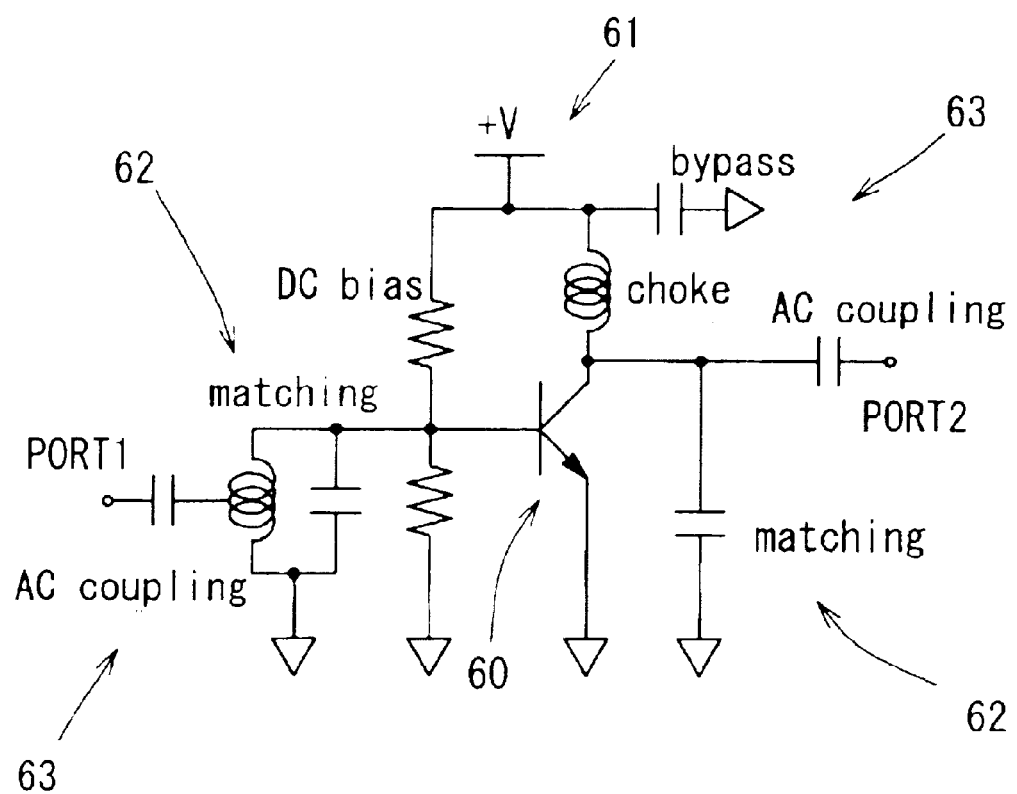
FIG. 24 is a circuit diagram showing a common-emitter amplifier circuit explaining the modification of the embodiment of the present invention.

FIG. 24 shows a common-emitter amplifier circuit, which is a basic amplifier circuit employing a bipolar transistor. A bipolar transistor 60 as the active electronic component under test (specimen) amplifies an AC signal. Also arranged together are electronic components such as a circuit 61 for driving the bipolar transistor 60, a circuit 62 for performing impedance matching with the bipolar transistor 60, and a coupling circuit 63 which blocks a DC voltage from and to an external circuit while allowing only an AC signal to pass therethrough. All these attribute to the difference in measurements between the above-referenced standard test fixture 5A' and production test fixture 5B'.

Figure 25:
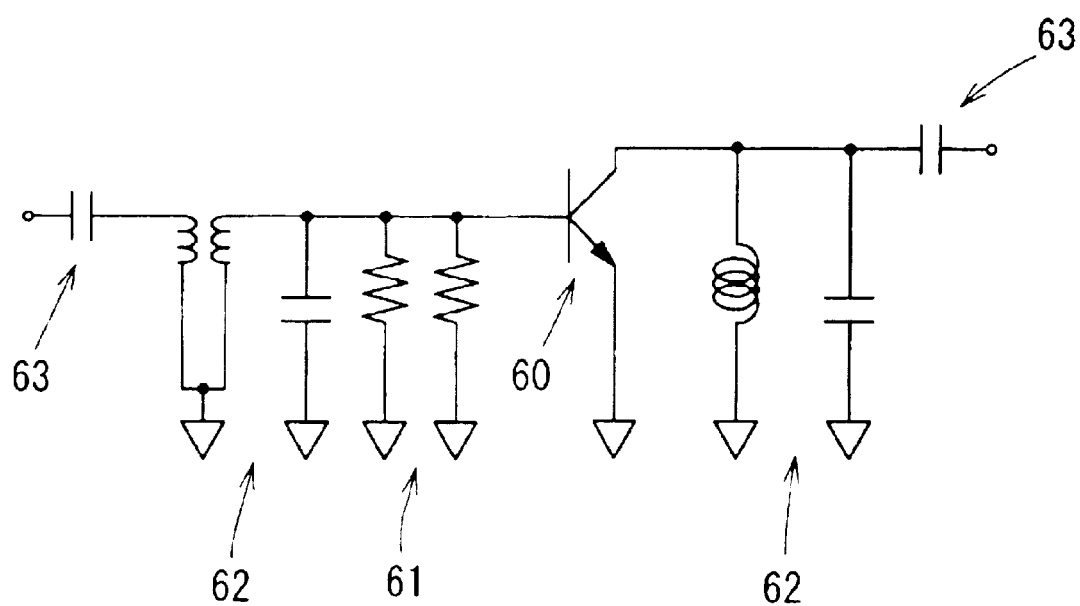
FIG. 25 is a circuit diagram into which the circuit shown in FIG. 24 is redrawn in terms of an AC operation on the assumption that a DC power supply is equivalent to a ground connection.
Figure 26:
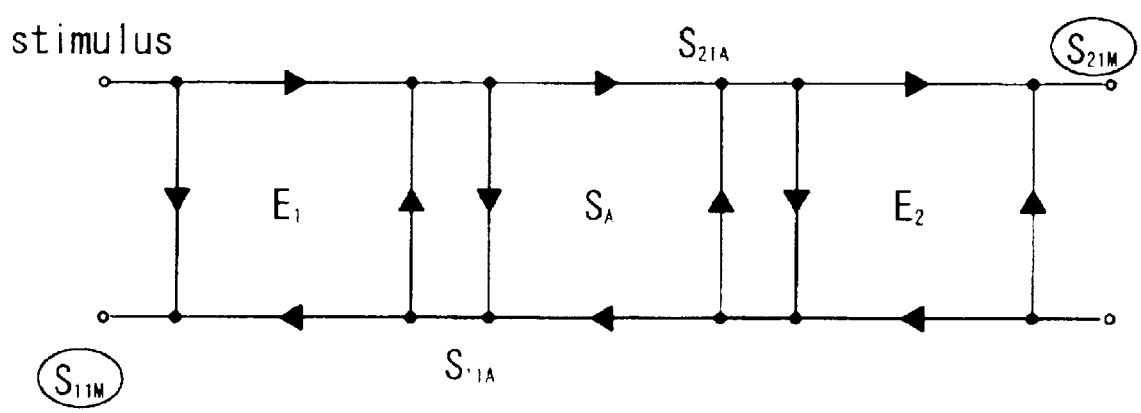
FIG. 26 is a signal flow diagram written based on the circuit diagram of FIG. 25.
Figure 27:
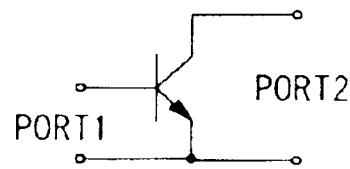
FIG. 27 is a circuit diagram showing a variety of (active) electronic components under test on which the measurement error correction method of the present invention is performed.
Figure 27:
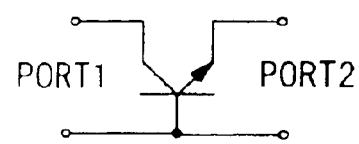
Figure 27:
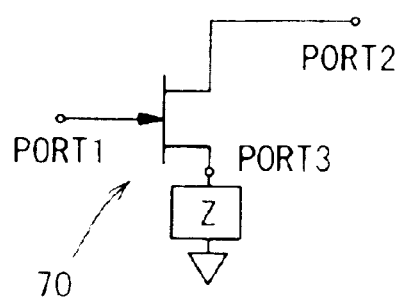
Figure 27:
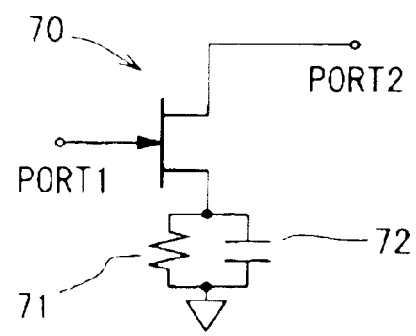
Figure 27:
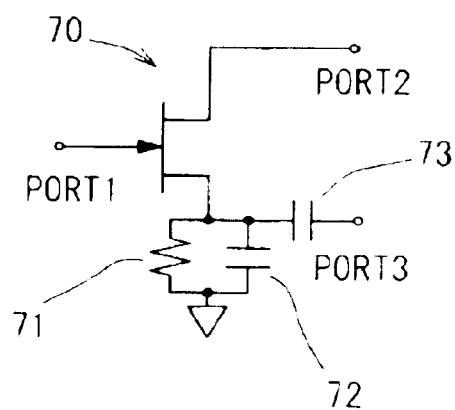
Figure 27:
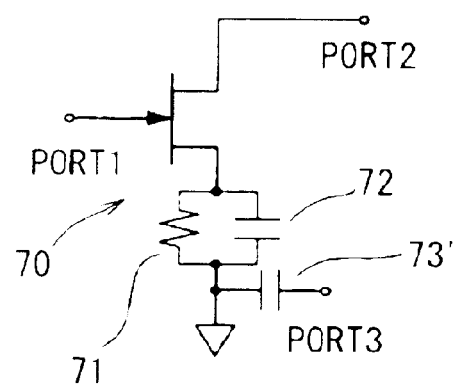

FIG. 25 is another version of the circuit of FIG. 24 which is redrawn in terms of an AC current operation taking into consideration that a DC power supply is equivalent to a ground connection. In the arrangement shown in FIG. 25, it is noted that a bias resistor has an AC impedance. As shown, elements connected in series with a transmission line, and shunted elements are all synthesized as a scattering coefficient. Let $E_1$ represent a scattering coefficient of a group of elements at a port 1 side and an error of the transmission line, $E_2$ represent a scattering coefficient of a group of elements at a port 2 side and an error of the transmission line, and $S_A$ represent a scattering coefficient of the bipolar transistor 60, and the circuit arrangement shown in FIG. 25 becomes a signal flow diagram shown in FIG. 26. The signal flow diagram shown in FIG. 26 is identical to one during measurement of a simple two-port passive device. The relative correction method of the present invention will be applied to the amplifier element in the same manner as a passive device as long as next six points are observed.

1. Substantially equal DC biasing state is set in the standard test fixture 5A' and the production test fixture 5B'.

This setting is required to avoid varying the true value of the amplifier element in the active electronic component under test 11A' and characteristics of a fixture circuit forming each of the standard test fixture 5A' and the production test fixture 5B'. It is expected that capacitors and inductors used in input and output impedance matching have no DC voltage dependent features, but there are times when a high dielectrics constant type ceramic capacitor is used for power supply bypassing purpose. There are cases where a semiconductor device such as a diode is used to stabilize a bias voltage. Depending on an applied DC bias, high frequency characteristics of the fixtures vary. By supplying the fixtures with the same power supply voltage as in the actual active electronic component under test 11A' during measurement, a difference in fixture characteristics between a measurement in a production test fixture mounted state and a measurement in a standard test fixture mounted state must be controlled. This requirement is easily satisfied by using a DC regulated power supply.

2. Sufficient bypassing is arranged at a DC voltage input to the production test fixture and the standard test fixture.

A circuit that supplies an amplifier element with a DC bias naturally allows some level of AC signal to leak. If leakage of an AC current is large, there is a possibility that measurement results vary due to a routing of lines from the DC power supply to the fixtures 5A' and 5B'. A bypassing capacitor having a sufficient capacitance is thus arranged at the DC voltage input to the fixtures 5A' and 5B' so that no AC signal leaks out of the fixture through a DC circuit. This requirement, not related to the present invention, causes a problem in repeatability of measurement values, for example, a measurement value changes if a DC current conducting wiring is touched with a hand. The requirement, although essentially unrelated to the present invention, must be observed.

3. Characteristic differences between the fixtures 5A' and 5B' must be as small as possible because a large characteristic difference between the fixtures 5A' and 5B leads to a narrow dynamic range.

The effect of difference between AC characteristics of fixture is theoretically corrected using the relative correction method. Some of measurement circuits having a amplifier element results in an extremely high gain in the vicinity of a resonance frequency, and a very low gain in the remaining frequency regions. If the resonance frequency of the fixture 5A' separates much from the resonance frequency of the fixture 5B', high gains of the standard test fixture measurement values $S_{21D}$ and $S_{11D}$ are estimated from low gains of the production test fixture measurement values $S_{21T}$ and $S_{11T}$. This may lead to an insufficient dynamic range. The fixtures 5A' and 5B' may be coarsely adjusted in characteristics so that the resonance frequencies thereof roughly match each other, and an adjustment insufficiency may be left to the responsibility of the correction adapter type relative correction method.

4. An input port of the correction data acquisition specimen is AC coupled.

To equalize the fixture characteristics of the correction data acquisition specimen 11B' to the fixture characteristics of the active electronic component under test 11A', the correction data acquisition specimen 11B' should be supplied with a voltage during measurement. However, if the correction data acquisition specimen 11B' is set up as a DC shorted specimen and then mounted on each of the fixtures 5A' and 5B', the DC bias state may change. For this reason, the port of the correction data acquisition specimen 11B' must block DC components.

5. The amplifier element must linearly operate when the (active) electronic component under test 11A' is an amplifier element (circuit).

A circuit operates in a non-linear fashion when the amplifier element becomes saturated in response to an excessively high level signal, or an output is clipped because of a power supply voltage of the circuit. There is no possibility that the relative correction method, which is a linear correction method, corrects characteristics obtained during a non-linear operation. If the active electronic component under test 11A' is an amplifier, the amplifier element must remain in a state in which a linear operation (class A operation) is expected such as in a region responsive to a low level signal.

6. The number of ports becomes very large in a complex device.

Even a simple power amplifier as the active electronic component under test 11A' is sometimes composed of multi-stages, which may be separately powered. In such a device, strictly speaking, a complete correction adapter type relative correction method is not carried out without observing responses from all power supply terminals thereof. The number of measurement ports substantially increases. In an ordinary amplifier circuit, power supply lines affecting the output thereof are limited. Ports having a marginal effect on the output may be neglected. For example, a typical amplifier includes two stages of voltage amplifier followed by one to two stages of power amplifier. In such an arrangement, a power supply line causing a difference in measurement results between the fixtures 5A' and 5B' is typically a first voltage amplifier stage. In the correction of the measurement results of the device, that power supply line only is corrected, and the remaining power lines may be neglected.

If at least one of the connection terminals arranged on the active electronic component under test 11A' is directly connected to or at least AC coupled to the ground potential of the fixtures 5A' and 5B', a specimen, as the correction data acquisition specimen 11B', having a variety of electrical characteristics with reference to the above mentioned ground potential is easily produced. However, if none of the connection terminals of the active electronic component under test 11A' are connected to the ground potential, and any electrical component is arranged with respect to the ground potential in the fixtures 5A' and 5B', the ground potential of the active electronic component under test 11A' serving as a reference for electrical characteristics to be set when manufacturing the correction data acquisition specimen 11B' cannot be set. In this case, the correction data acquisition specimen 11B' cannot be constructed.

In such a case, the following steps are taken:

Each of the standard test fixture 5A' and the production test fixture 5B' prepared has at least one connection terminal, connected to the ground potential thereof, in addition to connection terminals thereof corresponding to the ports of the correction data acquisition specimen 11B' and the (active) electronic component under test 11A'.

Prepared as the correction data acquisition specimen 11B' is at least one specimen having a terminal to be connected to the ground connection terminal of each of the fixtures 5A' and 5B'.

In the acquisition of the production test fixture measurement values $S_{21T}$ and $S_{11T}$ of the correction data acquisition specimen 11B' having the above-mentioned terminal, the electrical characteristics of the correction data acquisition specimen 11B' are measured with the above-mentioned terminal (of the correction data acquisition specimen 11B') connected to the ground connection terminals (of the fixtures 5A' and 5B').

The correction data acquisition specimen 11B' is embodied even when any electronic component is arranged with respect to the ground potential in the fixture circuit forming each of the standard test fixture 5A' and the production test fixture 5B'. The correction adapter type relative correction method of the present invention is thus carried out. The ground connection terminal is preferably connected to the ground potential of the fixture circuit.

In accordance with the above-referenced embodiment, the present invention is embodied when the measurement results that are obtained from measuring the electronic component under test 11A mounted on the production test fixture 5B using the production measurement apparatus 2 are corrected into the measurement results that are obtained from measuring the electronic component under test 11A mounted on the standard test fixture 5A using the standard measurement apparatus 1. The standard measurement apparatus 1 is defined as an example of apparatus which is different from the production measurement apparatus 2 in the measurement results of the electrical characteristics that are obtained from measuring the same electronic component. The present invention is equally embodied when the measurement results that are obtained from measuring the electronic component under test 11A mounted on the production test fixture 5B using the production measurement apparatus 2 are corrected into the measurement results that are obtained from measuring the active electronic component under test 11A mounted on the standard test fixture 5A using the production measurement apparatus 2.

As described above, in accordance with the present invention, the production test fixture measurement value obtained from the production measurement apparatus (using the production test fixture) is caused to match the standard test fixture measurement value obtained from the standard measurement apparatus (using the standard test fixture). The number of such correction data acquisition specimens required to perform a high-precision correction is set to a minimum number of three.

Although the present invention has been described in relation to particular embodiments thereof, many other variations and modifications and other uses will become apparent to those skilled in the art. Therefore, the present invention is not limited by the specific disclosure herein.

What is claimed is:

1. A method of correcting a measurement error in which when electrical characteristics of an electronic component under test having a plurality of ports are measured using a test instrument with the electronic component under test mounted on a production test fixture, a production test fixture measurement value of the electronic component under test using the production test fixture is corrected to electrical characteristics that are assumed to be obtained when one of the test instrument and another test instrument considered equivalent to the test instrument in measurement performance characteristic measures the electronic component under test in the mounted state thereof on a standard test fixture that results in a measurement result of electrical characteristic of the electronic component different from the measurement result of electrical characteristic of the electronic component provided by the production test fixture, the method comprising:

preparing at least three correction data acquisition specimens different in electrical characteristics and having an extremely small transmission coefficient between ports thereof;

acquiring a standard test fixture measurement value of the correction data acquisition specimens by measuring electrical characteristics of the correction data acquisition specimens in the mounted state thereof on the standard test fixture using one of the test instrument and the another test instrument;

acquiring a production test fixture measurement value of the correction data acquisition specimens by measuring electrical characteristics of the correction data acquisition specimens in the mounted state thereof on the production test fixture using one of the test instrument and the another test instrument;

identifying an error factor of a relative correction adapter from the standard test fixture measurement value and the production test fixture measurement value of the correction data acquisition specimens, wherein the relative correction adapter is modeled as including a two-port network connected to ports of the production test fixture adjacent to the test instrument, and as having a characteristic that modifies the electrical characteristics generated by the production test fixture having the electronic component under test mounted thereon into the electrical characteristics generated by the standard test fixture having the electronic component under test mounted thereon;

acquiring a production test fixture measurement value of the electronic component under test by measuring the electronic component under test in the mounted state thereof on the production test fixture using one of the test instrument and the another test instrument; and calculating a standard test fixture measurement value of the electronic component under test which is assumed to be obtained when one of the test instrument and the another test instrument measures the electronic component under test in the mounted state thereof on the standard test fixture, by correcting the production test fixture measurement value of the electronic component under test with the error factor of the relative correction adapter; and wherein the step of identifying the error factor of the relative correction adapter is performed in accordance with the following equation:

$Cl_{00}=$ $-(S_{11D1}*S_{11D3}*S_{11T2}*S_{11T}-S_{11D1}*S_{11D2}*S_{11T2}*S_{11T3}-$ $S_{11D2}*S_{11D3}*S_{11T1}*S_{11T3}+S_{11D1}*S_{11D2}*S_{11T1}*S_{11T3}+$ $S_{11D2}*S_{11D3}*S_{11T1}*S_{11T2}-S_{11D1}*S_{11D3}*S_{11T1}*S_{11T2})/$ $(S_{11D2}*S_{11D3}*S_{11T3}-S_{11D1}*S_{11D3}*S_{11T3}-S_{11D2}*S_{11D3}*S_{11T2}+$ $S_{11D1}*S_{11D2}*S_{11T2}+S_{11D1}*S_{11D3}*S_{11T1}-S_{11D1}*S_{11D2}*S_{11T1})$ $Cl_{01}=Cl_{10}=$ $\pm Sqrt((S_{11D2}-S_{11D1})*(S_{11D3}-S_{11D1})*(S_{11D3}-S_{11D2})*(S_{11T2}-S_{11T1})*$ $(S_{11T3}-S_{11T1})*(S_{11T3}-S_{11T2}))/$ $(S_{11D2}*S_{11D3}*S_{11T3}-S_{11D1}*S_{11D3}*S_{11T3}-S_{11D3}*S_{11D2}*S_{11T2}+$ $S_{11D1}*S_{11D2}*S_{11T2}+S_{11D1}*S_{11D3}*S_{11T1}-S_{11D1}*S_{11D2}*S_{11T1})$ $Cl_{11}=$ $((S_{11D2}-S_{11D1})*S_{11T3}+(S_{11D1}-S_{11D3})*S_{11T2}+$ $(S_{11D3}-S_{11D2})*S_{11T1})/(S_{11D2}*S_{11D3}*S_{11T3}-$ $S_{11D1}*S_{11D3}*S_{11T3}-S_{11D2}*S_{11D3}*S_{11T2}+$ $S_{11D1}*S_{11D2}*S_{11T2}+S_{11D1}*S_{11D3}*S_{11T1}-S_{11D1}*S_{11D2}*S_{11T1})$ (1)

where $Cl_{00}$, $Cl_{01}$, $Cl_{10}$, and $Cl_{11}$ represent error factors of the relative correction adapter, $S_{11D1}$, $S_{11D2}$, and $S_{11D3}$ represent the standard test fixture measurement values of the correction data acquisition specimens by the standard test fixture, and $S_{11T1}$, $S_{11T2}$, and $S_{11T3}$ represent the production test fixture measurement values of the correction data acquisition specimens by the production test fixture.

2. A method of correcting a measurement error according to claim 1, wherein the correction data acquisition specimen has a port to port transmission coefficient equal to or lower than −20 dB.

3. A method of correcting a measurement error according to claim 1, wherein the correction data acquisition specimens are different from each other in port reflection coefficient.

4. A method of correcting a measurement error according to claim 1, wherein the calculating step of the standard test fixture measurement value of the electronic component under test is performed in accordance with the following equation:

$Denom0=1-Cl_{11}*S_{11T}-C2_{11}*S_{22T}+Cl_{11}*C2_{11}*S_{21T}*S_{12T}+$
$Cl_{11}*C2_{11}*S_{11T}*S_{22T}S_{11D}=Cl_{00}+(Cl_{10}*Cl_{01}*S_{11T}-$
$Cl_{10}*Cl_{01}*C2_{11}*S_{11T}\cdot$ $S_{22T}+Cl_{10}*C2_{11}*Cl_{01}*S_{21T}*S_{12T})/Denom0S_{21D}=Cl_{10}*C2_{01}*S_{21T}/$
$Denom0\ Denom1=1-C2_{11}*S_{22T}-Cl_{11}*S_{11T}-$
$C2_{11}*Cl_{11}*S_{12T}*S_{21T}+C2_{11}*Cl_{11}*S_{22T}*S_{11T}S_{22D}-$ $C2_{00}+(C2_{10}*C2_{01}*S_{22T}-C2_{10}*C2_{01}*Cl_{11}*S_{22T}*S_{11T}+$
$C2_{10}*Cl_{11}*C2_{01}*S_{12T}*S_{21T})/Denom1S_{12D}=C2_{10}*Cl_{01}*S_{12T}/$
$Denom1$ (2).

5. A method of correcting a measurement error according to claim 1, wherein the correction data acquisition specimen has one port shorted, and another port having characteristics different from the characteristics of the one port.

6. A method of correcting a measurement error according to claim 1, wherein the correction data acquisition specimen has one port opened, and another port having characteristics different from the characteristics of the one port.

7. A method of correcting a measurement error according to claim 1, wherein the electrical characteristics of one of the correction data acquisition specimen and the electronic component under test are measured in a state that one of a DC current and a DC voltage is applied to the one of the correction data acquisition specimen and the electronic component under test through each fixture so that the value of the one of the DC current and the DC voltage applied to the one of the correction data acquisition specimen and the electronic component under test remains unchanged in each of the step of acquiring the standard test fixture measurement value of the correction data acquisition specimen, the step of acquiring the production test fixture measurement value of the correction data acquisition specimen, and the step of acquiring the production test fixture measurement value of the electronic component under test.

8. A method of correcting a measurement error according to claim 7, further comprising:
preparing, as the standard test fixture and the production test fixture, fixtures each having at least one ground connection terminal connected to a ground potential of the respective fixture in addition to connection terminals thereof corresponding to ports of the correction data acquisition specimen and the electronic component under test;
preparing, as the correction data acquisition specimen, at least one specimen having a terminal to be connected to the ground connection terminal; and
measuring the electrical characteristics of the correction data acquisition specimen with the terminal of the correction data acquisition specimen connected to the ground connection terminal in the step of acquiring the production test fixture measurement value of the correction data acquisition specimen having the terminal.

9. A method of correcting a measurement error according to claim 7, wherein the correction data acquisition specimen is structured and arranged such that at least one of the ports thereof prevents a DC current from flowing therethrough.

10. An electronic component characteristic measurement apparatus, including a test instrument that measures electrical characteristics of an electronic component under test having a plurality of ports in the mounted state thereof on a production test fixture, and correcting the electrical characteristics of the electronic component tested on the test instrument in the mounted state thereof on a production test fixture to electrical characteristics that are assumed to be obtained when one of the test instrument and another measurement apparatus including a test instrument considered equivalent to the test instrument in measurement performance characteristic measures the electronic component under test in the mounted state thereof on a standard test fixture that results in a measurement result of electrical characteristic of the electronic component different from the measurement result of electrical characteristic of the electronic component provided by the production test fixture, the electronic component characteristic measurement apparatus comprising:
means for acquiring a standard test fixture measurement value of the correction data acquisition specimen by measuring electrical characteristics of at least three correction data acquisition specimens, different in electrical characteristics and having an extremely small transmission coefficient between ports thereof, in the mounted state thereof on the standard test fixture, using the test instrument;
means for acquiring a production test fixture measurement value of the correction data acquisition specimens by measuring electrical characteristics of the correction data acquisition specimens in the mounted state thereof on the production test fixture using the test instrument;
means for identifying an error factor of a relative correction adapter from the standard test fixture measurement value and the production test fixture measurement value of the correction data acquisition specimens, wherein the relative correction adapter is modeled as including a two-port network connected to ports of the production test fixture adjacent to the measurement apparatus, and as having a characteristic that modifies the electrical characteristics generated by the production test fixture having the electronic component under test mounted thereon into the electrical characteristics generated by the standard test fixture having the electronic component under test mounted thereon; means for acquiring a production test fixture measurement value of the electronic component under test by measuring the electronic component under test in the mounted state thereof on the production test fixture using the test instrument; and
means for calculating a standard test fixture measurement value of the electronic component under test which is assumed to be obtained when one of the test instrument and the another measurement apparatus measures the electronic component under test in the mounted state thereof on the standard test fixture, by correcting the production test fixture measurement value of the electronic component under test with the error factor of the relative correction adapter and
wherein the means for identifying the error factor of the relative correction adapter identifies the error factor in accordance with the following equation:

$$C1_{00} = -(S_{11D1}*S_{11D3}*S_{11T2}*S_{11T}-S_{11D1}*S_{11D2}*S_{11T2}*S_{11T3}-S_{11D2}*S_{11D3}*S_{11T1}*S_{11T3}+S_{11D1}*S_{11D2}*S_{11T1}*S_{11T3}+S_{11D2}*S_{11D3}*S_{11T1}*S_{11T2}-S_{11D1}*S_{11D3}*S_{11T1}*S_{11T2})/$$

$$(S_{11D2}*S_{11D3}*S_{11T3}-S_{11D1}*S_{11D3}*S_{11T3}-S_{11D2}*S_{11D3}*S_{11T2}+$$

$$S_{11D1}*S_{11D2}*S_{11T2}+S_{11D1}*S_{11D3}*S_{11T1}-S_{11D1}*S_{11D2}*S_{11T1})$$

$$C1_{01} = C1_{10} =$$

$$\pm Sqrt((S_{11D2}-S_{11D1})*(S_{11D3}-S_{11D1})*(S_{11D3}-S_{11D2})*(S_{11T2}-S_{11T1})*(S_{11T3}-S_{11T1})*(S_{11T3}-S_{11T2}))/$$

$$(S_{11D2}*S_{11D3}*S_{11T3}-S_{11D1}*S_{11D3}*S_{11T3}-S_{11D2}*S_{11D3}*S_{11T2}+$$

$$S_{11D1}*S_{11D2}*S_{11T2}+S_{11D1}*S_{11D3}*S_{11T1}-S_{11D1}*S_{11D2}*S_{11T1})$$

$$C1_{11} =$$

$$((S_{11D2}-S_{11D1})*S_{11T3}+(S_{11D1}-S_{11D3})*S_{11T2}+(S_{11D3}-S_{11D2})*S_{11T1})/$$

$$(S_{11D2}*S_{11D3}*S_{11T3}-S_{11D1}*S_{11D3}*S_{11T3}-S_{11D2}*S_{11D3}*S_{11T2}+$$

$$S_{11D1}*S_{11D2}*S_{11T2}+S_{11D1}*S_{11D3}*S_{11T1}-S_{11D1}*S_{11D2}*S_{11T1}) \quad (1)$$

where $C1_{00}$, $C1_{01}$, $C1_{10}$, and $C1_{11}$ represent error factors of the relative correction adapter, $S_{11D1}$, $S_{11D2}$, and $S_{11D3}$ represent the standard test fixture measurement values of the correction data acquisition specimens by the standard test fixture, and $S_{11T1}$, $S_{11T2}$, and $S_{11T3}$ represent the production test fixture measurement values of the correction data acquisition specimens by the production test fixture.

11. An electronic component characteristic measurement apparatus according to claim 10, wherein the correction data acquisition specimen has one port shorted, and another port having characteristics different from the characteristics of the one port.

12. An electronic component characteristic measurement apparatus according to claim 10, wherein the correction data acquisition specimen has a port to port transmission coefficient equal to or lower than −20 dB.

13. An electronic component characteristic measurement apparatus according to claim 10, wherein correction data acquisition specimens are different from each other in port reflection coefficient.

14. An electronic component characteristic measurement apparatus according to claim 10, further comprising a DC power supply for supplying a DC current to the electronic component under test and the correction data acquisition specimen through the production test fixture and the standard test fixture, wherein each of the means for acquiring the standard test fixture measurement value of the correction data acquisition specimen, the means for acquiring the production test fixture measurement value of the correction data acquisition specimen, and the means for acquiring the production test fixture measurement value of the electronic component under test measures electrical characteristics of one of the correction data acquisition specimen and the electronic component under test in a state that one of a current or a voltage considered equivalent among the means is supplied from the DC power supply through the respective fixture to one of the correction data acquisition specimen and the electronic component under test.

15. An electronic component characteristic measurement apparatus according to claim 10, wherein the means for calculating the standard test fixture measurement value of the electronic component under test calculates the standard test fixture measurement value in accordance with the following equation:

$$Denom0 = 1 - C1_{11}*S_{11T} - C2_{11}*S_{22T} + C1_{11}*C2_{11}*S_{21T}*S_{12T} + C1_{11}*C2_{11}*S_{11T}*S_{22T}S_{11D} = C1_{00} + (C1_{10}*C1_{01}*S_{11T} - C1_{10}*C1_{01}*C2_{11}*S_{11T}*$$

$$S_{22T} + C1_{10}*C2_{11}*C1_{01}*S_{21T}*S_{12T})/Denom0 \, S_{21D} = C1_{10}*C2_{01}*S_{21T}/Denom0 \, Denom1 = 1 - C2_{11}*S_{22T} - C1_{11}*S_{11T} - C2_{11}*C1_{11}*S_{12T}*S_{21T+}$$

$$C2_{11}*C1_{11}*S_{22T}*S_{22T}S_{22D} = C2_{00} + (C2_{10}*C2_{01}*S_{22T} - C2_{10}*C2_{01}*C1_{11}*S_{22T}*S_{11T} + C2_{10}*C1_{11}*C2_{01}*S_{12T}*S_{21T})/Denom \, S_{12D} = C2_{10}*C1_{01}*S_{12T}/Denom1 \qquad (2).$$

16. An electronic component characteristic measurement apparatus according to claim 10, wherein the correction data acquisition specimen has one port opened, and another port having characteristics different from the characteristics of the one port.

\* \* \* \* \*